(12) United States Patent
Di Vincenzo et al.

(10) Patent No.: US 11,244,739 B2
(45) Date of Patent: Feb. 8, 2022

(54) COUNTER-BASED READ IN MEMORY DEVICE

(71) Applicant: Micron Technology, Inc., Boise, ID (US)

(72) Inventors: Umberto Di Vincenzo, Capriate San Gervasio (IT); Riccardo Muzzetto, Arcore (IT); Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/771,659

(22) PCT Filed: Dec. 23, 2019

(86) PCT No.: PCT/IB2019/001260
§ 371 (c)(1),
(2) Date: Jun. 10, 2020

(87) PCT Pub. No.: WO2021/130510
PCT Pub. Date: Jul. 1, 2021

(65) Prior Publication Data
US 2021/0225454 A1    Jul. 22, 2021

(51) Int. Cl.
*G11C 29/42* (2006.01)
*G11C 29/44* (2006.01)
(Continued)

(52) U.S. Cl.
CPC ............... *G11C 29/42* (2013.01); *G11C 7/14* (2013.01); *G11C 29/12005* (2013.01); *G11C 29/20* (2013.01); *G11C 29/44* (2013.01)

(58) Field of Classification Search
CPC .................................................... G11C 29/42
(Continued)

(56) References Cited

U.S. PATENT DOCUMENTS

| 6,728,133 B2 * | 4/2004 | Shimizu ................... G11C 8/12 |
| | | 365/185.03 |
| 7,321,513 B2 * | 1/2008 | Tsukidate ................. G11C 7/14 |
| | | 365/185.09 |

(Continued)

FOREIGN PATENT DOCUMENTS

| KR | 20180083689 A | 7/2018 |
| KR | 20180131023 A | 12/2018 |

OTHER PUBLICATIONS

ISA/KR,International Search Report and Written Opinion of the International Searching Authority,Int! Appl.No.PCT/IB2019/001260, dated Sep. 15, 2020,Korean Intellectual Property Office,Seo-gu,Daejeon,Republic of Korea,9pgs.*

(Continued)

*Primary Examiner* — Muna A Techane
(74) *Attorney, Agent, or Firm* — Holland & Hart LLP

(57) ABSTRACT

Methods and apparatuses with counter-based reading are described.

In a memory device, a memory cells of a codeword are accessed and respective voltages are generated. A reference voltage is generated and a logic state of each memory cell is determined based on the reference voltage and the respective generated cell voltage. The reference voltage is modified until a count of memory cells determined to be in a predefined logic state with respect to the last modified reference voltage value meets a criterium. In some embodiments the criterium may be an exact match between the memory cells count and an expected number of memory cells in the predefined logic state. In other embodiments, an error correction (ECC) algorithm may be applied while the difference between the count of cells in the predefined logic state and the expected number of cells in that state does not exceed a detection or correction power of the ECC.

28 Claims, 13 Drawing Sheets

(51) Int. Cl.
  *G11C 7/14*   (2006.01)
  *G11C 29/20*  (2006.01)
  *G11C 29/12*  (2006.01)
(58) Field of Classification Search
  USPC .................................................. 365/185.09
  See application file for complete search history.

(56) References Cited

U.S. PATENT DOCUMENTS

| | | |
|---|---|---|
| 8,780,637 B2 | 7/2014 | Yang |
| 2012/0075932 A1* | 3/2012 | Moschiano ........ G11C 16/3427 365/185.19 |
| 2012/0236655 A1* | 9/2012 | Yang ...................... G11C 16/28 365/185.21 |
| 2013/0223146 A1 | 8/2013 | Yang |
| 2014/0068382 A1* | 3/2014 | Desireddi ........... G06F 11/1048 714/773 |

OTHER PUBLICATIONS

Taiwan Intellectua Lproperty Office,"Office Action,"issued in connection with ROC(Taiwan) Patent Application No. 109142345,dated Aug. 20, 2021 (3pages).*
ISA/KR, International Search Report and Written Opinion of the International Searching Authority, Int'l Appl. No. PCT/IB2019/001260, dated Sep. 15, 2020, Korean Intellectual Property Office, Seo-gu, Daejeon, Republic of Korea, 9pgs.

* cited by examiner

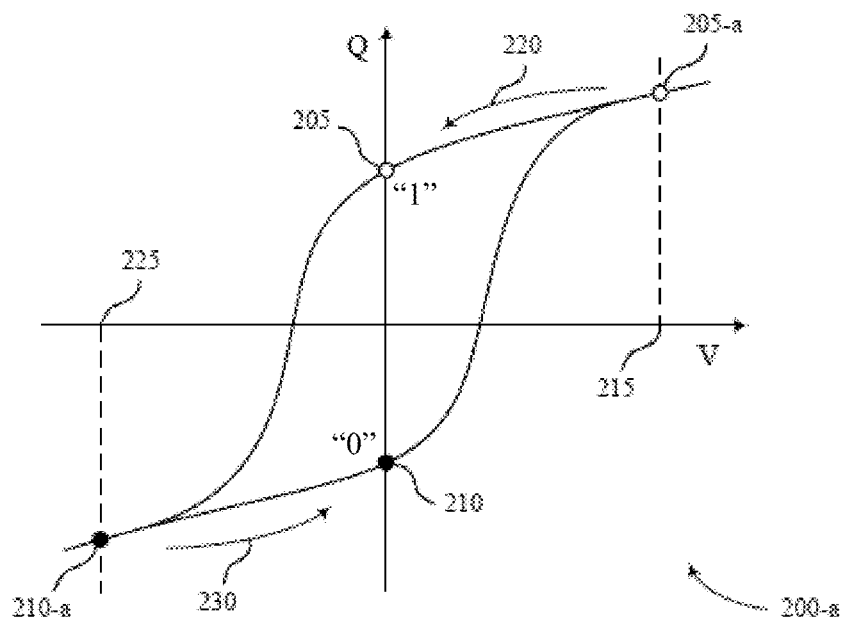
FIG. 2A
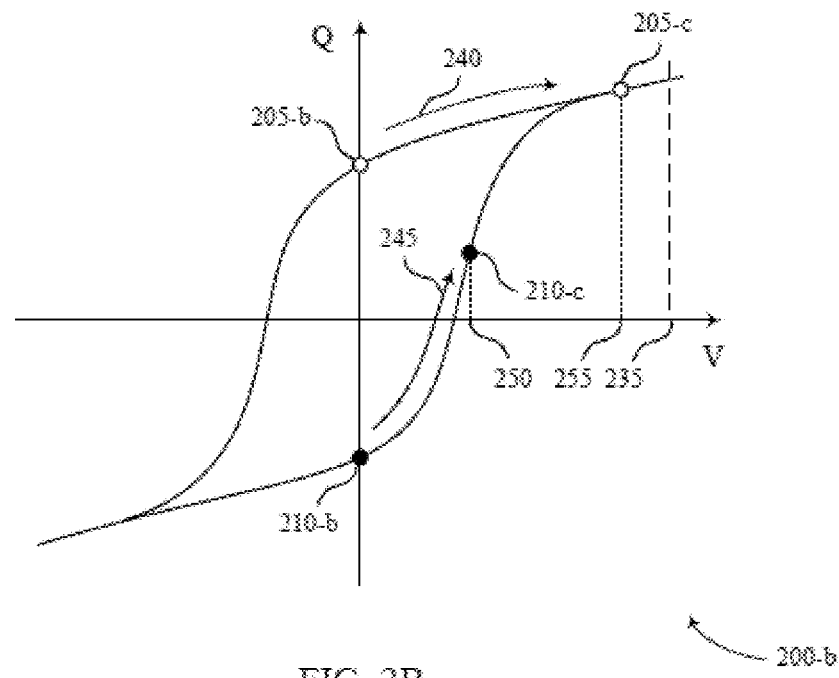
FIG. 2B
Figure 2

COUNTER-BASED READ IN MEMORY DEVICE

CROSS REFERENCE

The present Application for Patent is a 371 national phase filing of and claims priority to and the benefit of International Patent Application No. PCT/IB2019/001260 to Di Vincenzo et al., titled "COUNTER-BASED READ IN MEMORY DEVICE," filed Dec. 23, 2019, assigned to the assignee hereof, which is expressly incorporated herein by reference in its entirety.

Background

The following relates generally to memory devices and more specifically to memory devices with counter-based reading capability and methods thereof.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Reading memory devices is often difficult because there may be an insufficient margin between programmed states. Moreover, the programmed states are affected by usage, time and other conditions (for example number of reprogramming cycles, time lapsed since last programming operation, and/or temperature). Improving reading reliability and performance of memory devices is desirable.

BRIEF DESCRIPTION OF THE DRAWINGS

FIGS. 2A and 2B illustrate examples of hysteresis curves that support counter-based read in accordance with embodiments of the present disclosure.

DETAILED DESCRIPTION

Figure 1:
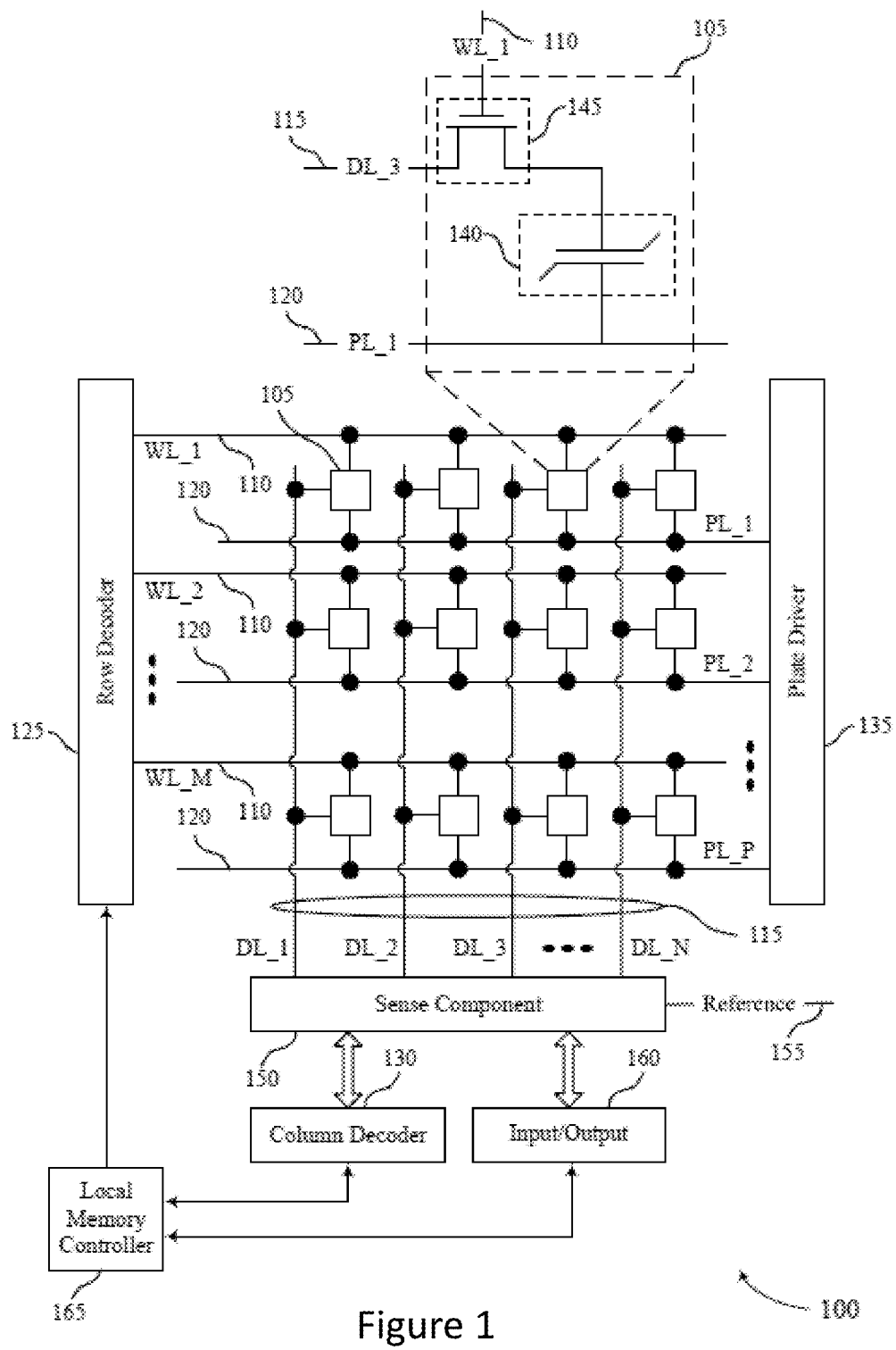
FIG. 1 illustrates an exemplary diagram of a memory device including an array of memory cells that supports counter-based read in accordance with embodiments of the present disclosure.

In a memory device, for example a ferroelectric (FeRAM) non-volatile memory device, during an access operation to program data corresponding to a codeword in memory cells of the array, the codeword data (and possible associated parity bits) are received at Input terminals of the memory device. The memory controller analyzes the input data and determines the number of bits in the different logic states; for example, the memory controller determines how many logic 0's and/or how many logic 1's are present in the codeword. The memory controller may manipulate, or encode, the codeword to minimize the number of bits in a predefined state; for example, the memory controller may invert all bits (e.g., bits at 0 are turned into 1 and bits at 1 are turned into 0) to minimize a count of bits at 1 (after the manipulation). The memory controller then proceeds with storing the manipulated codeword in the memory cells of the array. The information about whether the codeword data has been inverted/manipulated is also stored in one or more flip-bit(s); the memory controller also stores the information about the count of how many bits in the stored codeword are in the predefined state (e.g., how many bits are at 1). The flip-bit(s) and the number of bits in the predefined logic state may be programmed to memory cells of the array or other memory location anyway associated with the codeword.

During a subsequent access operation to read the data of the codeword, the memory controller retrieves the information about flip-bit(s) and the number of cells in the predefined logic state (e.g., how many cells in the codeword are at 1) and uses such information to read the data in a reliable way. As it will be clear from the description below, the reading reference voltage results in being codeword-specific, and intrinsically tracks any possible evolution or drift of the stored states.

Under control of the memory controller, each memory cell of the addressed codeword is accessed and it generates a voltage based on the state previously programmed in the memory cell. The voltage generated by each memory cell is compared with a reference voltage to determine a logic state of the memory cell. The generated cell voltage may be held, for example on a capacitor. The reference voltage is modified (e.g., increased or decreased in a ramp-like fashion, or dichotomously partitioning a reference voltage range) until a count of memory cells that have been determined to be in the pre-defined logic state meets a criterium; the criterium may be that the count of cells in the predetermined logic state matches the expected number, as retrieved by the memory controller. For example, a decreasing reference voltage ramp is selected (based on no bit flipping having occurred during the program operation), and the number of memory cells in the logic state 1 is determined during the reference voltage ramp; the reference voltage is decreased until the count of cells in the logic states 1 is the same as the number of cells that were programmed to that logic state.

Once the criterium is satisfied, the reading operation ends and data may be presented for output at the I/O terminals of the memory device; for example, when the number of cells read in the predefined logic states matches the expected number, an output is provided based on the determination of the logic states according to the last modified reference voltage.

Optionally, and in some cases preferably, according to some embodiments an error correction engine (ECC) may receive the intermediate readings during the reference voltage ramp and apply the ECC algorithm to determine whether the codeword, as read at the last modified reference voltage, may be corrected. If the codeword may be corrected, e.g., the ECC is capable to error correct the intermediate data, the reading operation ends and an output is provided based on the determination of the logic states according to the last modified reference voltage and the ECC correction. This may further speed up reading and anticipate the output with respect to an exact match. The ECC correction may be applied a multiplicity of times in a try and repeat fashion while the number of memory cells being determined to be in the predefined logic state differ from the expected number of bits in that state by no more than a detection or a correction power of the ECC.

In some embodiments, if the ECC engine has an error correcting power insufficient to error correct the intermediate data, a second error correction engine (ECC2), with higher correcting power than the first error correction engine may be applied to the intermediate data to fully correct it and an output is provided at the I/O terminals based on the determination of the logic states according to the last modified reference voltage and the ECC2 correction. For example, if an ECC1 is capable of detecting the presence of two errors but only capable of correcting one error and the ECC2 may be capable of correcting two errors, when the ECC1 detects the presence of two errors the ECC2 is applied to obtain a fully corrected codeword, without the need to activate the ECC2 every time.

In some embodiments, the information about flip-bit(s) and/or about the number of codeword bits may be stored in especially reliable form, such as using differential storage arrangement (e.g., two cells in opposite states to store one bit of information), a plurality of cells in majority voting arrangement (e.g., 5 cells for storing one bit the value of which is determined by the same reading of at least 3 of the 5 cells) and/or error correction protected.

In some embodiments, the reading or retrieving of the information about the flip-bit(s) and about the count of how many bits in the stored codeword are in the predefined state occurs at the latest concurrently to the signal development for each respective memory cell of the addressed codeword. In other words, a fast read component may mask reading the counter and/or the flip bit during the generation of the respective voltage for each respective cell in the codeword, for example. The memory controller timely has the information on which the decision about the type of ramp (e.g., increasing or decreasing) and about when to stop modifying the reference voltage are based on. In some cases, the information about bit-flip(s) and about number of codeword bits in the predefined state is retrieved before the reading operation, for example it may be retrieved at power-on and stored in DRAM for immediate use when necessary (at each program operation, both the DRAM and the non-volatile memory are up-dated with the information corresponding to the newly programmed data).

In some embodiments, the reference voltage for a codeword is set based at least in part on the count of codeword bits matching a number of bits in a pre-defined state. The reference voltage is changed (e.g., in a ramp-fashion manner) until the criterium is met. Codeword data are output at the meeting of the criterium. Optionally an error correction algorithm is applied to intermediate data (e.g., to intermediate readings during the reference voltage variation) and data are output also based on the error correction results.

Features of the disclosure are initially described in the context of a memory system and memory die as described with reference to FIGS. 1 and 2. Features of the disclosure are described in the context of counter-based reading techniques as described with reference to FIGS. 3-5. Aspects of the disclosure are described in more detail with reference to signal evolution and voltage distributions depicted in FIGS. 6-8. These and other features of the disclosure are further illustrated by and described with reference to apparatus diagrams and flowcharts that relate to counter-based reading techniques in memory devices as described with references to FIGS. 9-14.

FIG. 1 illustrates an example of a memory die 100 in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

A memory cell 105 may store a state (e.g., polarization state or dielectric charge) that represents digital data. In FeRAM architectures, the memory cell 105 may include a capacitor that includes a ferroelectric material to store a charge and/or a polarization representative of the programmable state. In DRAM architectures, the memory cell 105 may include a capacitor that includes a dielectric material to store a charge representative of the programmable state.

Operations such as reading and writing may be performed on memory cells 105 by activating or selecting access lines such as a word line 110, a digit line 115, and/or a plate line 120. In some cases, digit lines 115 may also be referred to as bit lines. References to access lines, word lines, digit lines, plate lines or their analogues, are interchangeable without loss of understanding or operation. Activating or selecting a word line 110, a digit line 115, or a plate line 120 may include applying a voltage to the respective line.

The memory die 100 may include the access lines (e.g., the word lines 110, the digit lines 115, and the plate lines 120) arranged in a grid-like pattern. Memory cells 105 may be positioned at intersections of the word lines 110, the digit lines 115, and/or the plate lines 120. By biasing a word line 110, a digit line 115, and a plate line 120 (e.g., applying a voltage to the word line 110, digit line 115, or plate line 120), a single memory cell 105 may be accessed at their intersection.

Accessing the memory cells 105 may be controlled through a row decoder 125, a column decoder 130, and a plate driver 135. For example, a row decoder 125 may receive a row address from the local memory controller 165 and activate a word line 110 based on the received row address. A column decoder 130 receives a column address from the local memory controller 165 and activates a digit line 115 based on the received column address. A plate driver 135 may receive a plate address from the local memory controller 165 and activates a plate line 120 based on the received plate address. For example, the memory die 100 may include multiple word lines 110, labeled WL_1 through WL_M, multiple digit lines 115, labeled DL_1 through DL_N, and multiple plate lines, labeled PL_1 through PL_P, where M, N, and P depend on the size of the memory array. Thus, by activating a word line 110, a digit line 115, and a plate line 120, e.g., WL_1, DL_3, and PL_1, the memory cell 105 at their intersection may be accessed. The intersection of a word line 110 and a digit line 115, in either a two-dimensional or three-dimensional configuration, may be referred to as an address of a memory cell 105. In some cases, the intersection of a word line 110, a digit line 115, and a plate line 120 may be referred to as an address of the memory cell 105.

In some cases, when memory cells 105 are under a low bias before the pre-charge phase, the access operation may be an open page access operation. For example, the local memory controller 165 may activate a row of memory cells comprising the memory cell 105 based on an open page access operation. In some cases, the memory cell 105 may receive, from a host device, an access command to perform the open page access operation on the memory cell 105. In such cases, the memory cell 105 may be accessed based on receiving the command.

The memory cell 105 may include a logic storage component, such as capacitor 140, and a switching component 145. The capacitor 140 may be an example of a ferroelectric capacitor. A first node of the capacitor 140 may be coupled with the switching component 145 and a second node of the capacitor 140 may be coupled with a plate line 120. The switching component 145 may be an example of a transistor or any other type of switch device that selectively establishes or de-establishes electronic communication between two components. The memory cell 105 may be a ferroelectric memory cell.

Selecting or deselecting the memory cell 105 may be accomplished by activating or deactivating the switching component 145. The capacitor 140 may be in electronic communication with the digit line 115 using the switching component 145. For example, the capacitor 140 may be isolated from digit line 115 when the switching component 145 is deactivated, and the capacitor 140 may be coupled with digit line 115 when the switching component 145 is activated. In some cases, the switching component 145 is a transistor and its operation is controlled by applying a voltage to a transistor gate, where the voltage differential between the transistor gate and transistor source is greater or less than a threshold voltage of the transistor. In some cases, the switching component 145 may be a p-type transistor or an n-type transistor. The word line 110 may be in electronic communication with the gate of the switching component 145 and may activate/deactivate the switching component 145 based on a voltage being applied to word line 110.

A word line 110 may be a conductive line in electronic communication with a memory cell 105 that is used to perform access operations on the memory cell 105. In some architectures, the word line 110 may be in electronic communication with a gate of a switching component 145 of a memory cell 105 and may be configured to control the switching component 145 of the memory cell. In some architectures, the word line 110 may be in electronic communication with a node of the capacitor of the memory cell 105 and the memory cell 105 may not include a switching component. In some examples, a voltage may be applied to the word line 110 during an access phase of the access operation. In such cases, the memory cell 105 may be accessed based on applying the voltage to the word line 110.

A digit line 115 may be a conductive line that connects the memory cell 105 with a sense component 150. In some architectures, the memory cell 105 may be selectively coupled with the digit line 115 during portions of an access operation. For example, the word line 110 and the switching component 145 of the memory cell 105 may be configured to selected couple and/or isolate the capacitor 140 of the memory cell 105 and the digit line 115. In some architectures, the memory cell 105 may be in electronic communication (e.g., constant) with the digit line 115. In some examples, a voltage may be applied to the digit line 115 to bias the memory cell between an activate pulse and pre-charge pulse.

A plate line 120 may be a conductive line in electronic communication with a memory cell 105 that is used to perform access operations on the memory cell 105. The plate line 120 may be in electronic communication with a node (e.g., the cell bottom) of the capacitor 140. The plate line 120 may be configured to cooperate with the digit line 115 to bias the capacitor 140 during access operation of the memory cell 105. In some examples, a voltage may be applied to the plate line 120 to bias the memory cell between an activate pulse and pre-charge pulse.

The sense component 150 may be configured to determine a state (e.g., a polarization state or a charge) stored on the capacitor 140 of the memory cell 105 and determine a logic state of the memory cell 105 based on the detected state. The charge stored by a memory cell 105 may be extremely small, in some cases. As such, the sense component 150 may include one or more sense amplifiers to amplify the signal output of the memory cell 105. The sense amplifiers may detect minute changes in the charge of a digit line 115 during a read operation and may produce signals corresponding to either a logic 0 or a logic 1 based on the detected charge. During a read operation, the capacitor 140 of memory cell 105 may output a signal (e.g., discharge a charge) to its corresponding digit line 115. The signal may cause a voltage of the digit line 115 to change. The sense component 150 may be configured to compare the signal received from the memory cell 105 across the digit line 115 to a reference signal 155 (e.g., a reference voltage). The sense component 150 may determine the stored state of the memory cell 105 based on the comparison. For example, in binary-signaling, if digit line 115 has a higher voltage than the reference signal 155, the sense component 150 may determine that the stored state of memory cell 105 is a logic 1, and, if the digit line 115 has a lower voltage than the reference signal 155, the sense component 150 may determine that the stored state of the memory cell 105 is a logic 0. The sense component 150 may include various transistors or amplifiers to detect and amplify a difference in the signals. The detected logic state of the memory cell 105 may be provided as an output of the sense component 150 (e.g., to an input/output 160), and may indicate the detected logic state to another component of a memory device that includes the memory die 100, such as a device memory controller (e.g., directly or using the local memory controller 165). In some cases, the sense component 150 may be in electronic communication with the row decoder 125, the column decoder 130, and/or the plate driver 135.

The local memory controller 165 may control the operation of memory cells 105 through the various components (e.g., row decoder 125, column decoder 130, plate driver 135, and sense component 150). In some cases, one or more of the row decoder 125, column decoder 130, and plate driver 135, and sense component 150 may be co-located with the local memory controller 165. The local memory controller 165 may be configured to receive one or more commands and/or data from an external memory controller, translate the commands and/or data into information that can be used by the memory die 100, perform one or more operations on the memory die 100, and communicate data from the memory die 100 to the external memory controller (or the device memory controller) in response to performing the one or more operations. The local memory controller 165 may generate row, column, and/or plate line address signals to activate the target word line 110, the target digit line 115, and the target plate line 120. The local memory controller 165 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 165 may be configured to perform a pre-charge operation on the memory die 100. A pre-charge operation may comprise pre-charging one or more components and/or access lines of the memory die 100 to one or more predetermined voltage levels. In some instances, the memory cell 105 and/or portions of the memory die 100 may be pre-charged between different access operations. In some instances, the digit line 115 and/or other components may be pre-charged before a read operation. In some cases, memory cell 105 may be biased to a low voltage before the pre-charge operation. In such cases, the memory cell 105 may remain under the low bias between an access operation and the pre-charge operation. Maintaining a low bias on the memory cell 105 between the access operation and the pre-charge operation may increase the functionality of the memory cell 105.

In some cases, the local memory controller 165 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 165 may identify a target memory cell 105 on which to perform the write operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or the target plate line 120 (e.g., applying a voltage to the word line 110, digit line 115, or the plate line 120), to access the target memory cell 105. The local memory controller 165 may apply a specific signal (e.g., voltage) to the digit line 115 and a specific signal (e.g., voltage) to the plate line 120 during the write operation to store a specific state in the capacitor 140 of the memory cell 105, the specific state being indicative of a desired logic state. In some examples, the open page access operation is a write operation. In such cases, the state stored on the memory cell 105 may be identified as part of the write operation. The value of the voltage applied between the activate pulse and the pre-charge pulse of the pre-charge phase may be based on the state of the memory cell 105. In some examples, the value of the voltage applied between the activate pulse and the pre-charge pulse may be based on the state of the memory cell 105 during the write operation.

In some cases, the local memory controller 165 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 165 may identify a target memory cell 105 on which to perform the read operation. The local memory controller 165 may identify a target word line 110, a target digit line 115, and/or a target plate line 120 in electronic communication with the target memory cell 105 (e.g., the address of the target memory cell 105). The local memory controller 165 may activate the target word line 110, the target digit line 115, and/or a target plate line 120 (e.g., applying a voltage to the word line 110, the digit line 115, or the plate line 120), to access the target memory cell 105. The target memory cell 105 may transfer a signal to the sense component 150 in response to biasing the access lines. The sense component 150 may amplify the signal. The local memory controller 165 may fire the sense component 150 (e.g., latch the sense component) and thereby compare the signal received from the memory cell 105 to the reference signal 155. Based on that comparison, the sense component 150 may determine a logic state that is stored on the memory cell 105. The local memory controller 165 may communicate the logic state stored on the memory cell 105 to the external memory controller (or the device memory controller) as part of the read operation. According to embodiments of the invention, the local memory controller 165 may also provide a reference voltage to the sense component 150 for evaluation of a logic state of each memory cell 110 with respect to that specific reference voltage. The local controller 165 may modify the reference voltage until a criterium is met, as it will be described in detail below.

In some memory architectures, accessing the memory cell 105 may degrade or destroy the logic state stored in a memory cell 105. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 165 may perform a re-write operation or a refresh operation to return the memory cell to its original logic state. The local memory controller 165 may re-write the logic state to the target memory cell after a read operation. In some cases, the re-write operation may be considered part of the read operation. Additionally, activating a single access line, such as a word line 110, may disturb the state stored in some memory cells in electronic communication with that access line. Thus, a re-write operation or refresh operation may be performed on one or more memory cells that may not have been accessed. In some examples, applying a voltage during the delay phase of the access operation may not affect the refresh operation.

FIGS. 2A and 2B illustrate examples of non-linear electrical properties of a ferroelectric memory cell with hysteresis curves 200-*a* and 200-*b* in accordance with various examples as disclosed herein. Hysteresis curves 200-*a* and 200-*b* illustrate an example ferroelectric memory cell writing and reading process, respectively. Hysteresis curves 200-*a* and 200-*b* depict the charge, Q, stored on a ferroelectric capacitor (e.g., capacitor 140 described with reference to FIG. 1) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 200-*a* and 200-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 200-*a* and 200-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 200-*a* and 200-*b*.

As depicted in hysteresis curve 200-*a*, the ferroelectric material may maintain a positive or negative polarization with a zero-voltage difference, resulting in two possible charged states: a charge state 205 and a charge state 210. According to the examples of FIGS. 2A and 2B, charge state 205 represents a logic 1 and charge state 210 represents a logic 0. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 215 across the capacitor results in charge accumulation until charge state 205-*a* is reached. Upon removing voltage 215, charge state 205-*a* follows path 220 until it reaches charge state 205 at zero voltage. Similarly, charge state 210 is written by applying a net negative voltage 225, which results in charge state 210-*a*. After removing negative voltage 225, charge state 210-*a* follows path 230 until it reaches charge state 210 at zero voltage. Charge states 205-*a* and 210-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 205-*b* or 210-*b* was initially stored. For example, hysteresis curve 200-*b* illustrates two possible stored charge states 205-*b* and 210-*b*. Voltage 235 may be applied across the capacitor 140 as discussed with reference to FIG. 1. In other cases, a fixed voltage may be applied to the cell plate and, although depicted as a positive voltage, voltage 235 may be negative. In response to voltage 235, charge state 205-*b* may follow path 240. Likewise, if charge state 210-*b* was initially stored, then it follows path 245. The final position of charge state 205-*c* and charge state 210-*c* depend on one or more factors, including the specific sensing scheme and circuitry.

In some cases, the final charge may depend on the intrinsic capacitance of the digit line connected to the memory cell. For example, if the capacitor is electrically connected to the digit line and voltage 235 is applied, the voltage of the digit line may rise due to its intrinsic capacitance. A voltage measured at a sense component may not equal voltage 235 and instead may depend on the voltage of the digit line. The position of final charge states 205-*c* and 210-*c* on hysteresis curve 200-*b* may thus depend on the capacitance of the digit line and may be determined through a load-line analysis—i.e., charge states 205-*c* and 210-*c* may be defined with respect to the digit line capacitance. As a result, the voltage of the capacitor, voltage 250 or voltage 255, may be different and may depend on the initial state of the capacitor.

By comparing the digit line voltage to a reference voltage, the initial state of the capacitor may be determined. The digit line voltage may be the difference between voltage 235 and the final voltage across the capacitor, voltage 250 or voltage 255—i.e., the difference between the voltage 235 and the voltage 250 or the different between the voltage 235 and the voltage 255. A reference voltage may be generated such that its magnitude is between the two possible voltages of the two possible digit line voltages to determine the stored logic state i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 1 or 0) may be determined. As it is apparent from the description above, the logic value assigned to a memory cells not only depends on the digit line voltage, but also on the reference voltage used in the comparison. Independently of how accurately and precisely the reference voltage is selected and generated, there are cases in which it is not reliable (and even not possible) to carry out a reading operation with a sole reference voltage for all memory cells.

In some cases, a ferroelectric memory cell may maintain the initial logic state after a read operation. For example, if charge state 205-*b* is stored, the charge state may follow path 240 to charge state 205-*c* during a read operation and, after removing voltage 235, the charge state may return to initial charge state 205-b by following path 240 in the opposite direction. In some cases, a ferroelectric memory cell may lose its initial logic state after a read operation. For example, if charge state 210-b is stored, the charge state may follow path 245 to charge state 205-c during a read operation and, after removing voltage 235, the charge state may relax to the charge state 205-b by following path 240.

Hysteresis curve 200-b illustrates an example of reading a memory cell that is configured to store the charge state 205-b and the charge state 210-b. A read voltage 235 may be applied, for example, as a voltage difference via a digit line 115 and a plate line 120 as described with reference to FIG. 1. Hysteresis curve 200-b may illustrate read operations where the read voltage 235 is negative voltage difference Vcap (e.g., where Vbottom−Vplate is negative). A negative read voltage across the capacitor may be referred to as a "plate high" read operation, where a plate line 120 is taken initially to a high voltage, and a digit line 115 is initially at a low voltage (e.g., a ground voltage). Although read voltage 235 is shown as a negative voltage across the ferroelectric capacitor 140, in alternative operations a read voltage may be a positive voltage across the ferroelectric capacitor 140, which may be referred to as a "plate low" read operation.

The read voltage 235 may be applied across the ferroelectric capacitor 140 when a memory cell 105 is selected (e.g., by activating a switching component 145 as described with reference to FIG. 1). Upon applying the read voltage 235 to the ferroelectric capacitor 140, charge may flow into or out of the ferroelectric capacitor 140 via the digit line 115 and plate line 120, and different charge states may result depending on whether the ferroelectric capacitor 140 was at charge state 205 (e.g., a logic 1) or at charge state 210 (e.g., a logic 0). Physical differences among memory cells and/or usage differences (e.g., number of programming/reading cycles, time lapsed since last access, etc.) may result in a spread of charge stored on the ferroelectric capacitor and/or the digit line voltage developed during a read operation, making very difficult, if not at all impossible, to reliably determine the logic state stored in a memory cell using a sole reference voltage to discriminate between the two possible states.

Figure 3:
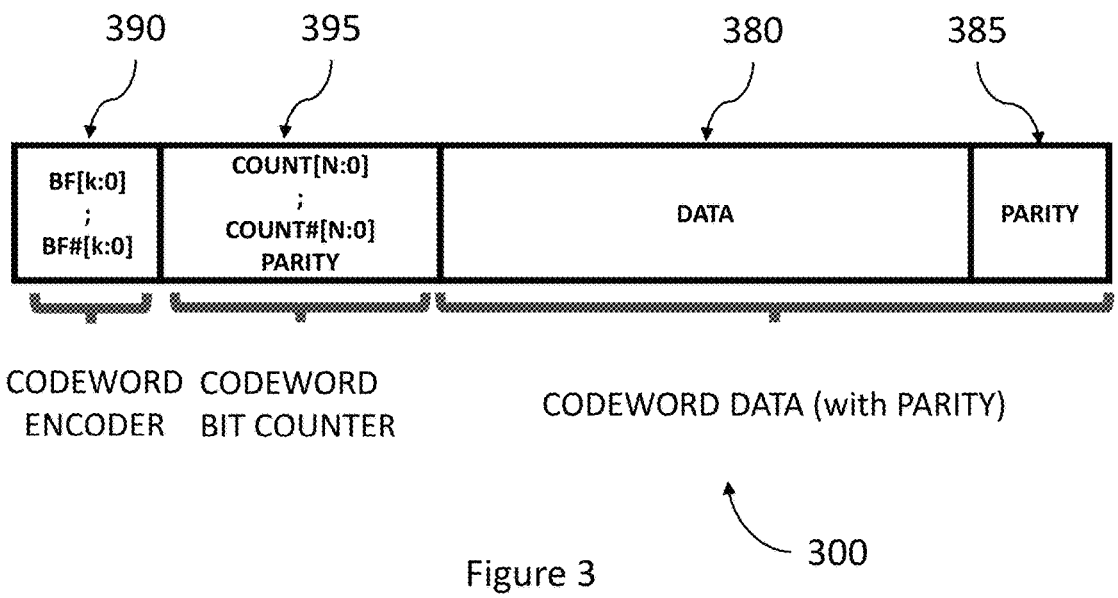
FIG. 3 illustrates an example of a codeword of a memory array that supports counter-based read in accordance with embodiments of the present disclosure.

FIG. 3 illustrates an example of a codeword of a memory array that supports counter-based read in accordance with embodiments of the present disclosure. A codeword 300 of a memory device, such as the memory device 100 of FIG. 1, may comprise a DATA region 380 for storing the codeword data and an optional PARITY region 385, possibly comprising parity data associated to the codeword data. The parity data may be error correction parity bits, in some examples.

Associated with the DATA 380 and PARITY 385, is provided a CODEWORD ENCODER region 390 for storing encoding bits. Examples of encoding bits include a flip-bit, that may be indicative of all the bits in the codeword DATA 380 and PARITY 385 regions having been inverted (e.g., each bit intended to represent a logic 0 has been stored as a 1 state and vice-versa). More than one flip-bit (BF[k:0]) may be present, for example to implement more complex encoding. As mere illustrative example, a first flip-bit may be indicative of possible bit inversion in the first half of the codeword data/parity and a second flip-bit may be indicative of possible bit inversion in the second half of the codeword data/parity. Each true flip-bit (BF[k:0]) value may be also stored with its false value (BF#[k:0]), to improve reliability of the information therein. Properly encoding the codeword DATA 380 and PARITY 385 may insure that the number of bits in a predefined logic state is always less or equal to a given number (e.g., half of the total number of bits using simple bit flipping)

Associated with the DATA 380 and the PARITY 385 is provided a CODEWORD BIT COUNTER region 385 for storing a number of bits of DATA 380 and PARITY 385 in a predefined logic state. The number of bits in the bit counter region (COUNT[N:0]) depends on the total DATA 380 and PARITY 385 bit count and the particular encoding used. For example, with 8 DATA bits and 4 ECC PARITY bits (total of 12), using simple bit flipping, the maximum bit count in any given logic state is 6, so a 3 bit CODEWORD BIT COUNTER 395 is sufficient (COUNT[2:0]). With a 128 bits data a 8 bits ECC parity may be necessary (total 136 bits), so the CODEWORD BIT COUNTER has 8 bits to store the maximum value of 68. Each bit counter bit (COUNT[N:0]) may be also stored with its false value (COUNT#[N:0]), to improve reliability of the information therein. The CODEWORD BIT COUNTER 395 bits and the flip-bits in the CODEWORD ENCODER 390 may be stored with a different arrangement, for example a majority voting arrangement. They may further be protected by error correction, in some embodiments.

When data is received at input terminals for programming in the memory, the memory controller analyzes the data and determines the encoding to be applied (e.g., whether to flip the bits) and finally determines a number of bits in the predefined state (e.g., how many bits are stored in the memory cells as a logic 1 state, for example). When the encoded/manipulated DATA 380 and PARITY 385 are written to the memory cells (for example memory cells 105), the associated bit-flip information is stored in the codeword encoder 390 region and the number of bits in the predefined state is stored in the associated bit counter 395 region. CODEWORD ENCODER 390 and CODEWORD BIT COUNTER 395 regions may comprise cells in the memory array (e.g., cells 105) or other memory cells. In some embodiments, the encoding and bit count information is also stored in DRAM for immediate use.

The information respectively stored in the CODEWORD ENCODER 390 and CODEWORD BIT COUNTER 395 regions is used during a subsequent access operation to retrieve the codeword data, e.g., during a read operation, as it will be explained in detail below.

Figure 4:
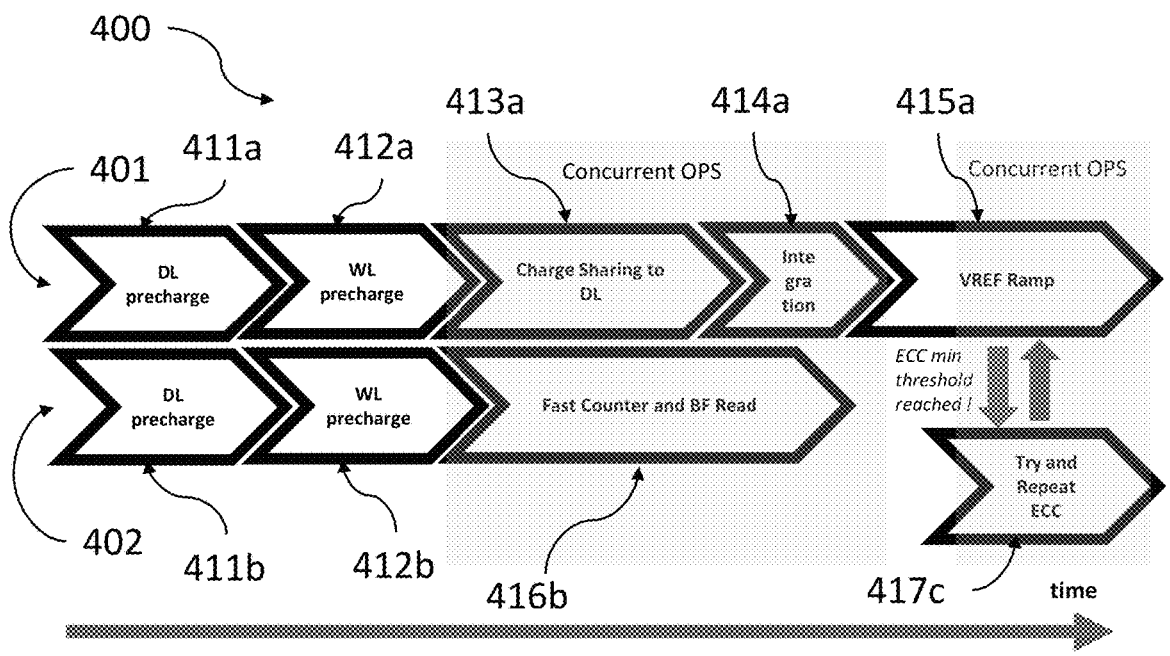
FIG. 4 illustrates an example of concurrent operations during an access to a memory array that supports counter-based read in accordance with embodiments of the present disclosure.

FIG. 4 illustrates an example of concurrent operations during an access to a memory array that supports counter-based read in accordance with embodiments of the present disclosure.

The diagram 400 of FIG. 4 represents a time evolution—from left to right—of a first sequence 401 of operations during an access to read information from a codeword, such as codeword 300 and in particular from DATA 380 and PARITY 385 regions of the codeword 300. The memory cells storing the information may be memory cells 105, for example. Also shown in FIG. 4 is a second sequence 402 of operations during the read operation; sequence 402 may be applied to memory cells 105 containing the codeword's ENCODER 390 and/or BIT COUNTER 395 information, in some examples. In other examples, the ENCODER 390 and/or BIT COUNTER 395 information may be immediately available, e.g., because stored in a volatile memory and there is no need to perform the second sequence 402 of operations.

The two sequences 401 and 402 have common operations that may be carried out at the same time and differentiated operations that may carried out concurrently as described below. Both sequences start with a Digit Line (DL) pre-charge operation 411a-411b, during which the digit line (e.g., DL 115) of memory cells 105 in respective first plurality of cells (e.g., memory cells corresponding to DATA 380 and PARITY 385 regions) and second plurality of cells (e.g., memory cells corresponding to ENCODER 390 and BIT COUNTER 395 regions) is pre-charged as described above with reference to FIG. 1. The DL pre-charge operation 411a-411b may be a common operation for cells in the first plurality and cells in the second plurality.

When the DL pre-charge operation 411a-411b is completed, both sequences continue with a Word Line (WL) pre-charge operation 412a-412b during which the word line (e.g., WL 110) of memory cells 105 in respective plurality of cells is pre-charged as described above with reference to FIG. 1. The WL pre-charge operation 412a-412b may be a common operation for cells in the first plurality and cells in the second plurality.

When the WL pre-charge operation 412a-412b is completed, operations in the two sequences, e.g., on the memory cells of the first and second plurality, differentiate.

According to sequence of operations 402, ENCODER 390 and BIT COUNTER 395 cells undergo a fast counter and flip bit (BF) read 416b. This operation may be carried out relatively faster than a conventional read operation exploiting, for example, the differential storage of each bit in the ENCODER 390 and BIT COUNTER 395 regions. At the end of the fast counter and flip bit read operation 416b, the number of bits in the pre-defined logic state and the encoding information (e.g., if and which bits have been flipped) are available for use during the sensing of memory cells in the DATA 380 and PARITY 385 regions. Memory cells in the ENCODER 390 and BIT COUNTER 395 regions are not further stimulated until a write back operation (not shown).

Concurrently with the fast counter and flip bit read operation 416b, according to sequence of operations 401, DATA 380 and PARITY 385 cells undergo a charge sharing operation to digit line (DL) 413a during which the voltage of the digit line associated to each cell is modifies based on the presence or absence of polar charge on the ferroelectric capacitor, as described above with reference to FIG. 2. When the charge sharing operation 413a is complete, an integration operation 414a is carried out on DATA 380 and PARITY 385 memory cells, to generate a voltage useful for the sense component, e.g., sense component 150 in FIG. 1, to determine the logical state stored in the memory cells. Integration operation 414a may be concurrent with fast counter and flip bit read operation 416b. in some embodiments.

Subsequent to the integration operation 414a, according to sequence 401 of operations, a reference voltage (VREF) ramp operation 415a is applied to bits in DATA 380 and PARITY 385 regions to determine the logical state stored therein. In some embodiments, a reference voltage is modified until a match in a count of memory cells in a pre-defined state (as determined with respect to the last modified reference voltage) meets a criterium, for example the count of memory cells equals the number of memory cells in the pre-defined logic state as retrieved from the BIT COUNTER 395, as it will be explained in detail below, with reference to FIGS. 5-8. In some embodiments, a try and repeat Error Correction Code (ECC) operation 417c is concurrently applied to the VREF ramp operation 415a to finalize the reading in advance, if no failing cell is detected, or correcting identified errors, if any. The try and repeat ECC operation 417c is not an alternative to the VREF ramp operation 415a and rather co-operates with it to implement the reading access operation as a whole.

Figure 5:
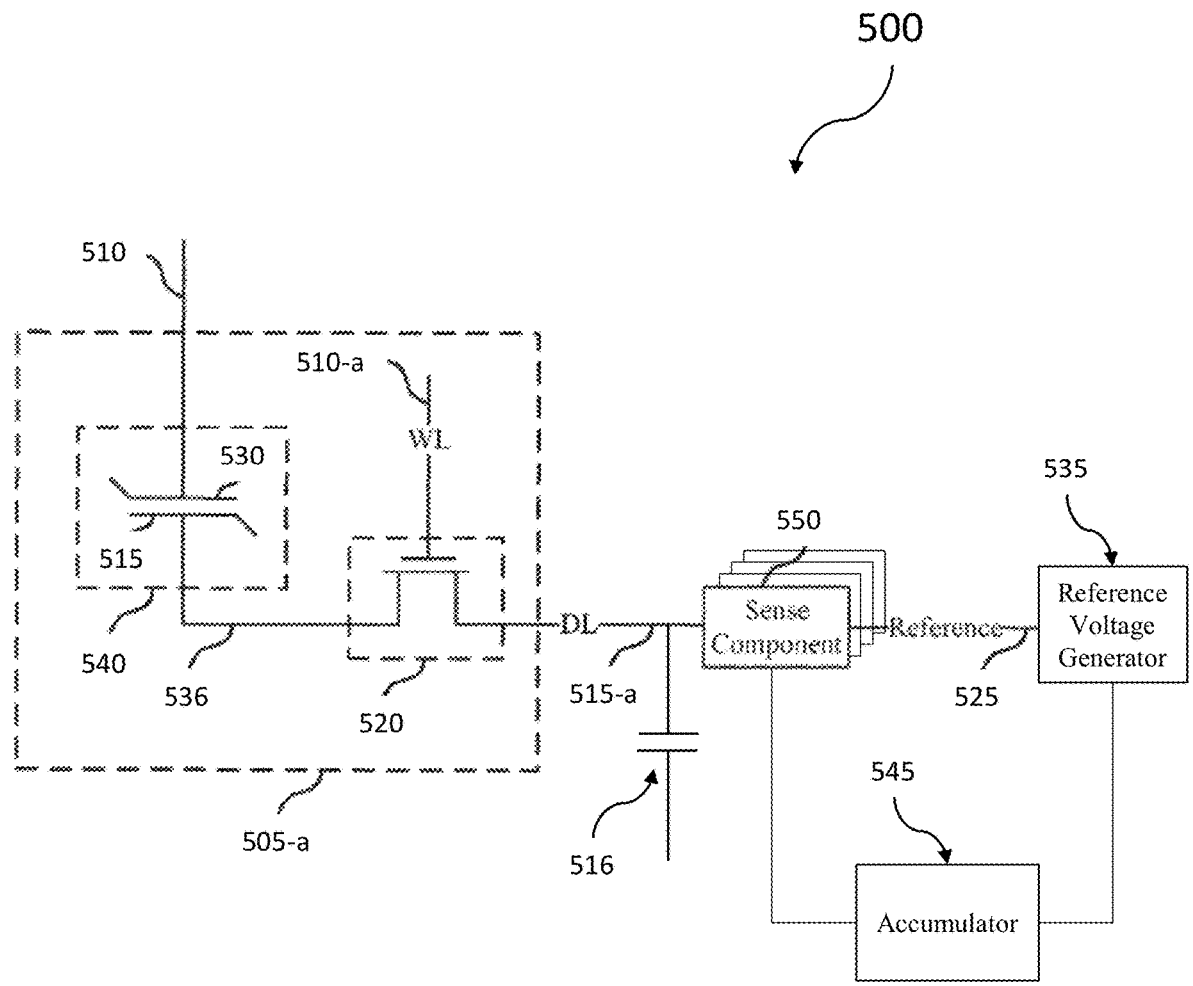
FIG. 5 illustrates an example of sensing blocks in a memory device that supports counter-based read in accordance with embodiments of the present disclosure.

FIG. 5 illustrates an example of sensing blocks in a memory device that supports counter-based read in accordance with embodiments of the present disclosure.

Circuit 500 includes a memory cell 505-a, word line 510-a, digit line 515-a, and sense component 550, which may be examples of a memory cell 105, word line 110, digit line 115 and sense component 150, respectively, as described with reference to FIG. 1. Memory cell 505-a may include a logic storage component, such as capacitor 540 that has a first plate, cell plate 530, and a second plate, cell bottom 515. Cell plate 530 and cell bottom 515 may be capacitively coupled through a ferroelectric material positioned between them. The orientation of cell plate 530 and cell bottom 515 may be flipped without changing the operation of memory cell 505-a. Circuit 500 also includes selection component 520 and reference line 525. Cell plate 530 may be accessed via plate line 510 and cell bottom 515 may be accessed via digit line 515-a. As described above, various states may be stored by charging or discharging capacitor 540. In some cases, the cell bottom 515 (or the cell plate 530 as the case may be) may cooperate with the selection component 520 to form a middle node 536. In some instances, the middle node 536 may store a charge. In some examples, the charge stored on the middle node 536 may contribute, at least in part, to the dielectric charge state of the memory cell 505-a. Circuit 500 also includes a reference voltage generator 535 coupled to the sense component 550 and an accumulator 545, coupled to the sense component 550. The reference voltage generator 535 is coupled to the accumulator 545 and is configured to provide a on reference line 525 a reference signal that may be modified during a read operation based on a bit count value in the accumulator 545.

The stored state of capacitor 540 may be read or sensed by operating various elements represented in circuit 500. Capacitor 540 may be in electronic communication with digit line 515-a. For example, capacitor 540 can be isolated from digit line 515-a when selection component 520 is deactivated, and capacitor 540 can be connected to digit line 515-a when selection component 520 is activated. Activating selection component 520 may be referred to as selecting memory cell 505-a. In some cases, selection component 520 is a transistor and its operation is controlled by applying a voltage to the transistor gate, where the voltage magnitude is greater than the threshold magnitude of the transistor. Word line 510-a may activate selection component 520; for example, a voltage applied to word line 510-a is applied to the transistor gate, connecting capacitor 505 with digit line 515-a. As discussed in more detail below, the logic state of a memory cell 505-a may be determined based on a comparison of a voltage developed on DL 515-a and a reference voltage that is modified until a bit count criterium is met.

Due to the ferroelectric material between the plates of capacitor 540, and as discussed in more detail below, capacitor 540 may not discharge upon connection to digit line 515-a. In one scheme, to sense the logic state stored by ferroelectric capacitor 505, word line 510-a may be biased to select memory cell 505-a and a voltage may be applied to plate line 510. In some cases, digit line 515-a is virtually grounded and then isolated from the virtual ground, which may be referred to as "floating," prior to biasing plate line 510 and word line 510-a. Biasing plate line 510 may result in a voltage difference (e.g., plate line 510 voltage minus digit line 515-a voltage) across capacitor 540. The voltage difference may yield a change in the stored charge on capacitor 540, where the magnitude of the change in stored charge may depend on the initial state of capacitor 540— e.g., whether the initial state stored a logic 1 or a logic 0. This may cause a change in the voltage of digit line 515-*a* based on the charge stored on capacitor 540. Operation of memory cell 505-*a* by varying the voltage to cell plate 530 may be referred to as "moving cell plate." In some instances, the digit line 515-*a* may be charged to a predetermined voltage level during a read operation.

Figure 6:
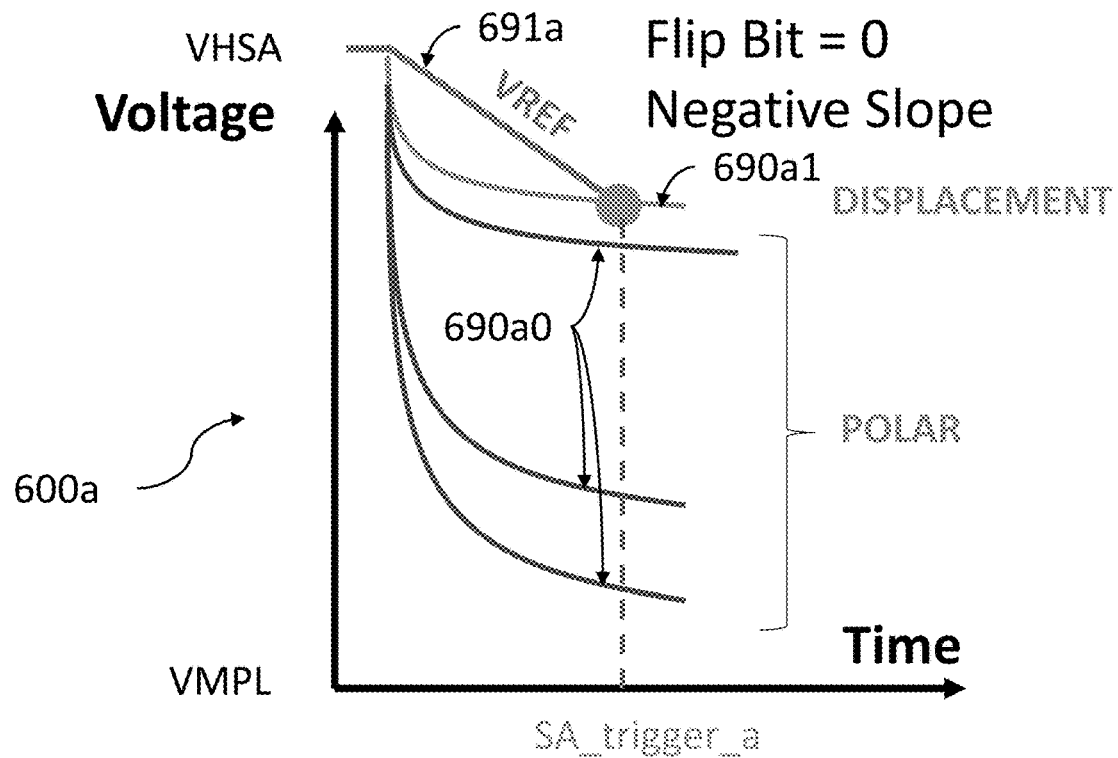
FIG. 6 illustrate examples of signals time evolution during an access to a memory array that supports counter-based read in accordance with embodiments of the present disclosure.
Figure 6:
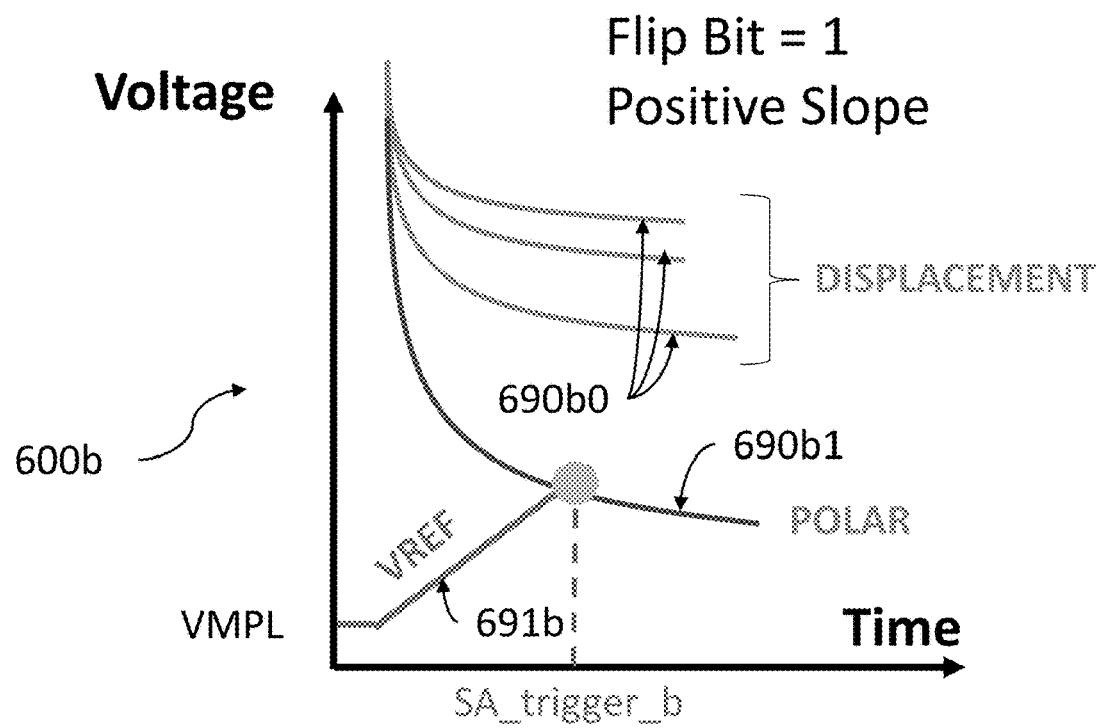
Figure 7:
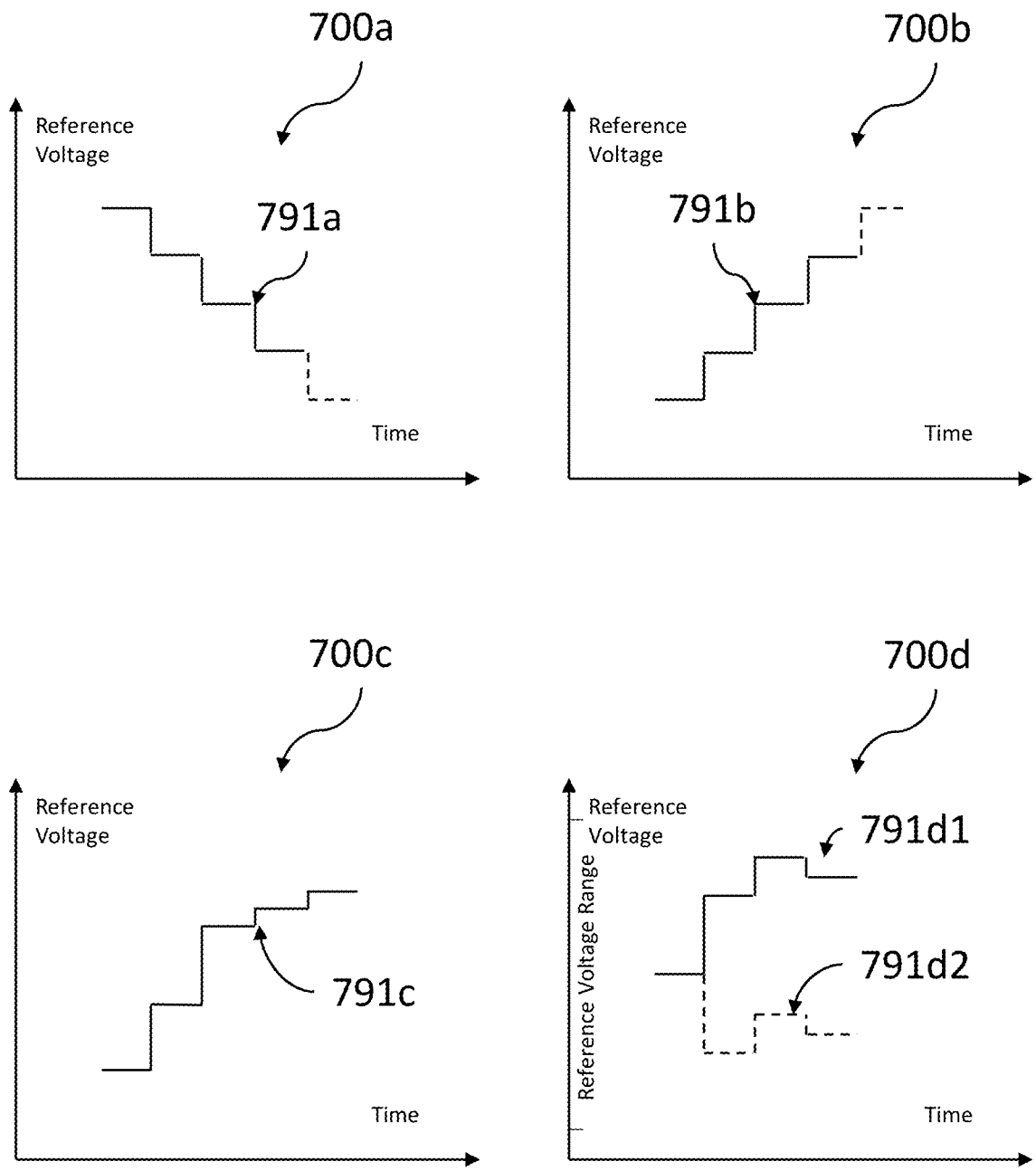
FIG. 7 illustrates examples reference voltage time evolution during an access to a memory array that supports counter-based read in accordance with embodiments of the present disclosure.

The change in voltage of digit line 515-*a* may depend on its intrinsic capacitance (represented by capacitor 516 in FIG. 5). That is, as charge flows through digit line 515-*a*, some finite charge may be stored in digit line 515-*a* and the resulting voltage depends on the intrinsic capacitance 516. The intrinsic capacitance 516 may depend on physical characteristics, including the dimensions, of digit line 515-*a*; in some embodiments, intrinsic capacitance 516 includes an actual capacitor designed for the purpose of optimizing the voltage holding capabilities of digit line 515-*a*. Digit line 515-*a* may connect many memory cells 505-*a* so digit line 515-*a* may have a length that results in a non-negligible capacitance (e.g., on the order of picofarads (pF)). The resulting voltage of digit line 515-*a* may then be compared to a reference (e.g., a voltage of reference line 525) by sense component 550 in order to determine the stored logic state in memory cell 505-*a* at the given reference voltage. The accumulator 545 may count how many cells 505-*a* (cells 105 of FIG. 1—for example cells on a same addressed WL 510-*a*, corresponding to WL 110 in FIG. 1) have been determined to be in a given logic state (with respect to the used reference voltage). Based at least in part on the count of cells in the given logic state, the reference voltage generator 535 may modify the reference voltage on reference line 525 and a new determination is made. The reference voltage may be modified, by the reference voltage generator 325, increasing or decreasing (e.g., ramping) the voltage or increasing and decreasing the voltage (e.g., according to a search algorithm such as a dichotomous range partitioning algorithm) until a match is found between the count by the accumulator and a number stored in the codeword bit counter 395. FIGS. 6 and 7 show some examples of modified reference voltage. Optionally, an error correction engine is also activated, for example when the count by the accumulator differs by the number stored in the codeword bit counter by no more than a correction capability of the error correction engine.

Sense component 550 may include various transistors or amplifiers to detect and amplify a difference in signals, which may be referred to as latching. Sense component 550 may include a sense amplifier that receives and compares the voltage of digit line 515-*a* and reference line 525, which may be a reference voltage. The sense amplifier output may be driven to the higher (e.g., a positive) or lower (e.g., negative or ground) supply voltage based on the comparison. For instance, if digit line 515-*a* has a higher voltage than reference line 525, then the sense amplifier output may be driven to a positive supply voltage. Sense component 550 may then latch the output of the sense amplifier and/or the voltage of digit line 515-*a*, which may be used to determine the stored state in memory cell 505-*a*, e.g., logic 1. Alternatively, if digit line 515-*a* has a lower voltage than reference line 525, the sense amplifier output may be driven to a negative or ground voltage. Sense component 550 may similarly latch the sense amplifier output to determine the stored state in memory cell 505-*a*, e.g., logic 0. Each cell 105 in the addressed DATA 380 and PARITY 385 codeword is determined to be in either the 1 or the 0 logic state with respect to the applied reference voltage.

The accumulator 545 counts how many cells are in a predetermined logic state and if this count does not match a number of cells in the codeword expected to be in the predefined logic state, the reference voltage generator 535 modifies the reference voltage and a new determination is done. The reference voltage generator may modify the reference voltage by ramping it until a match occurs (e.g., if N cells are expected to be in the logic state 1, the reference voltage is modified until N cells are determined to be in the 1 logic state with respect to the last modified reference voltage). The reference voltage may be modified, by the reference voltage generator 325, increasing or decreasing (e.g., ramping) the voltage or increasing and decreasing the voltage (e.g., according to a search algorithm such as a dichotomous range partitioning algorithm) until a match is found between the count by the accumulator and a number stored in the codeword bit counter 395. FIGS. 6 and 7 show some examples of modified reference voltage. In some embodiments, an error correction code ECC engine is applied when the count by the accumulator differs from the expected number by not more than a correction capability of the ECC (for example, if the ECC engine is able to correct 2 errors and are expected N bits in the predefined logic state, the ECC may be activated when the count is in the range N−2 to N+2, or, in other words, the count is N−2, or N−1, or N, or N+1 or N+2). Application of an ECC may accelerate the reading operation (e.g., not all steps to a full matching condition are needed), as it will be described, for example, with reference to FIG. 8. The ECC application may refer to the try and repeat Error Correction Code (ECC) operation 417*c* in FIG. 4. If the ECC is able to correct the errors, the read operation ends. The latched (and possibly ECC corrected) logic states of memory cells 505-*a* may then be output, for example, to local memory controller 165 through Input/output 160 with reference to FIG. 1.

To write memory cell 505-*a*, a voltage may be applied across capacitor 505. Various methods may be used. In one example, selection component 520 may be activated through word line 510-*a* in order to electrically connect capacitor 505 to digit line 515-*a*. A voltage may be applied across capacitor 505 by controlling the voltage of cell plate 530 (through plate line 510) and cell bottom 515 (through digit line 515-*a*). To write a logic 0, cell plate 530 may be taken high, that is, a positive voltage may be applied to plate line 510, and cell bottom 515 may be taken low, e.g., virtually grounding or applying a negative voltage to digit line 515-*a*. The opposite process is performed to write a logic 1, where cell plate 530 is taken low and cell bottom 515 is taken high. In some examples, the write procedure may be modified to account for multiple bits being stored in a single memory cell. As discussed with reference to FIG. 3, when writing DATA 380 and PARITY 385 bits, the information may be encoded (storing the corresponding bit-flip information in the CODEWORD ENCODER 390); moreover, the number of bits in a predefined logic state is counted and stored in the CODEWORD BIT COUNTER 395 for future use at a subsequent access operation.

FIG. 6 illustrate examples of signals time evolution during an access to a memory array that supports counter-based read in accordance with embodiments of the present disclosure. Diagrams 600*a* (top) and 600*b* (bottom) depict a time evolution of voltages developed during a read operation of different cells; time is represented on the horizontal X axis and voltage is represented on the vertical Y axis.

For improved clarity, an example including only 4 cells is represented in the drawings; a different number of cells, often many more, can be involved in other examples. The 4 depicted bits may be representative of the information stored in a codeword. Accordingly, the 4 bits may include DATA 380 and possibly PARITY 385 bits, as described with reference to FIG. 3, for example. In the example described below, it is also assumed that the information (DATA and PARITY) is 0001.

For the discussion below, a one flip-bit encoding is used; the corresponding information is stored in differential form as (BF[0:0];BF#[0:0]) in the CODEWORD ENCODER 390. Accordingly, CODEWORD ENCODER 390 will be (10) in case of no flipping and it will be (01) in case the codeword DATA 380 and PARITY 385 are flipped. Other forms to store the flip bit information are possible.

CODEWORD BIT COUNTER 395 information is also stored, in the example presented below, in differential form as (COUNT[1:0];COUNT#[1:0]). Accordingly, since the example codeword has a sole bit in logic state 1 (e.g., the least significant bit of 0001), the value (1001) is differentially stored in the CODEWORD BIT COUNTER, where the most significant pair of bits 10 represent zero and the least significant pair of bits represent one, for a total count of one bit in the predefined logic state. Other forms for storing the bit count information are possible, for example majority voting form. Despite a 2 bit COUNT is used in this example, it should be noted that it is always possible (e.g., by bit flipping the entire codeword) to encode the codeword so that the number of bits in a predefined state is not greater than 50% of the bits in the codeword. The size of COUNT in the CODEWORD BIT COUNTER 395 will be set accordingly and its relative impact on the codeword dimension (in terms of additional bits) will be reduced with increasing codeword size.

In summary, under the assumptions adopted for the example in consideration, the codeword 300 [BF,COUNT,DATA&PARITY] is: 10,1001,0001 in case of no bit flipping encoding and 01,1001,1110 in case of DATA and PARITY bit flipping. Note that the relative overhead (e.g., bits for CODEWORD ENCODER and for CODEWORD BIT COUNTER over the bits in DATA and PARITY) decreases with larger codewords because the bits in the CODEWORD ENCODER may remain unchanged and the number of bits in the CODEWORD BIT COUNTER only increase logarithmically with DATA and PARITY bits.

Diagram 600a represents a case in which no bit flipping has been applied to the codeword. Curve 690a1 is representative of digit line voltage evolution of a cell programmed to a logical state 1, e.g., the least significant bit in codeword (0001). The capacitor of this memory cell has no polar charge and during reading it only develops displacement charge. Curves 690a0 are representative of digit line voltage evolution of a cell programmed to a logical state 0, e.g., the second, third and fourth least significant bits in codeword (0001). The capacitor of these memory cells has polar charge stored in it.

Similarly, diagram 600b represents a case in which bit flipping has been applied to the codeword. Curve 690b1 is representative of digit line voltage evolution of a cell programmed to a (flipped) logical state 1 (e.g., the least significant bit in codeword (0001). According to the applied encoding, the capacitor of this memory cell has polar charge. Curves 690b0 are representative of digit line voltage evolution of a cell programmed to a (flipped) logical state 0 (e.g., the second, third and fourth least significant bits in codeword (0001). According to the applied encoding, the capacitor of these memory cells has no polar charge stored in it. In both the examples depicted in diagrams 600a and 600b it would be very difficult to uniquely and accurately set the appropriate reference level according to the known reading approaches. Moreover, the actual digit line voltage may change with usage (e.g., cycling, time lapsed from last programming event, etc.) as well as processing conditions (e.g., minimal differences during manufacturing may result in substantial reading voltage variations), therefore reducing the reading margin.

A decreasing reference voltage ramp 691a (diagram 600a) may be provided by the reference voltage generator 535 to the sense component 550, in some embodiments. For example, in case of no bit flipping, the reference voltage ramp 691a may start at a relatively high voltage VHSA and decrease in time. The voltage VHSA may be higher than any expected digit line voltage at the beginning of the reading operation, in some examples. Sense component 550 detects, at time SA_trigger_a, when the reference voltage ramp 691a crosses curve 690a1 (e.g., the reference voltage becomes lower than the digit line voltage of the corresponding memory cell, that in this example is the one associated to the least significant codeword bit). At this time, the accumulator 545 increases the count of cells in a predefined logic state (not flipped logic state 1, in this example). It is checked whether the count of cells in the predetermined logic state matches a criterium; for example, it is checked whether the count of cells in the accumulator is equal to the value COUNT in BIT COUNTER 395. Since a match occurs (e.g., the count of memory cells equals the number of memory cells in the pre-defined logic state as retrieved from the CODEWORD BIT COUNTER 395), the read operation may end and data 0001 may be output considering that no bit flip is necessary (as obtained from information in CODEWORD ENCODER 390).

In other words, a plurality of memory cells has been accessed (e.g., the codeword cells), a respective voltage for each respective cell has been generated (e.g., the signal developed by each cells during charge sharing and integration phases, that depends on the stored charge being displacement or polar charge, for example—the generated voltage developing and been held at the input of the sense component), a reference voltage has been generated (e.g., the decreasing reference voltage, where it has been decided it to decrease based on the flip-bit information—that is no bit flipping in diagram 600a—associated to the codeword), a logic state of each cell has been determined with respect to the reference voltage and the reference voltage has been modified until a count of cells in a predefined logic state meets a criterium, where the criterium, in this example, is a match of the count cells in logic state 1 (e.g., one cell at time SA_trigger_a) and the value in CODEWORD BIT COUNTER 395 (one as stored at time of programming codeword DATA and PARITY).

An increasing reference voltage ramp 691b (diagram 600b) may be provided by the reference voltage generator 535 to the sense component 550, in some embodiments. For example, in case of bit flipping, the reference voltage ramp 691b may start at a relatively low voltage VMPL and increase in time. The voltage VMPL may be lower than any expected digit line voltage at the beginning of the reading operation, in some examples. Sense component 550 detects, at time SA_trigger_b, when the reference voltage ramp 691b crosses curve 690b1 (e.g., the reference voltage becomes higher than the digit line voltage of the corresponding memory cell, that in this example is the one associated to the least significant codeword bit). At this time, the accumulator 545 increases the count of cells in a predefined logic state (flipped logic state 1, in this example). It is checked whether the count of cells in the predetermined logic state matches a criterium; for example, it is checked whether the count of cells in the accumulator is equal to the value COUNT in CODEWORD BIT COUNTER 395. Since a match occurs (e.g., the count of memory cells equals the number of memory cells in the pre-defined logic state as retrieved from the BIT COUNTER 395), the read operation may end and data 0001 may be output considering that bit flip is necessary (as obtained from information in CODEWORD ENCODER 390).

In other words, a plurality of memory cells has been accessed (e.g., the codeword cells), a respective voltage for each respective cell has been generated (e.g., the signal developed by each cells during charge sharing and integration phases, that depends on the stored charge being displacement or polar charge, for example—the generated voltage developing and been held at the input of the sense component), a reference voltage has been generated (e.g., the increasing reference voltage, where it has been decided it to increase based on the flip-bit information—that is bit flipping in diagram 600b—associated to the codeword), a logic state of each cell has been determined with respect to the reference voltage and the reference voltage has been modified until a count of cells in a predefined logic state meets a criterium, where the criterium, in this example, is a match of the count cells in flipped logic state 1 (e.g., one cell at time SA_trigger_b) and the value in CODEWORD BIT COUNTER 395 (one as stored at time of programming codeword DATA and PARITY).

It should be noted that in either case, e.g., either in case of no bit flipping (diagram 600a) or in case of bit flipping (diagram 600b), the read operation stops when the criterium is met. In the depicted examples, this occurs when one cell is determined to be in the predefined logic state (based on codeword content). More generally, at most half of the codeword memory cells need to be determined in the predefined logic state; in fact it is possible to bit-flip or not bit-flip the codeword and generate an increasing or decreasing reference voltage ramp to minimize the number of bits in the predefined logic state. This reduces the reading time. The examples above and other examples are further described with reference to FIG. 7.

FIG. 7 illustrates examples reference voltage time evolution during an access to a memory array that supports counter-based read in accordance with embodiments of the present disclosure. Diagrams 700a, 700b, 700c and 700d depict examples of reference voltage (reported on the vertical Y axis) evolution with time (reported on the horizontal X axis).

Curve 791a in diagram 700a has a decreasing step-wise evolution with time. It may be an example of curve 691a discussed with reference to FIG. 6 (diagram 600a). At each time interval, the reference voltage has a constant value that is provided by a common reference voltage generator 535 to the sense component 550 of each memory cell 505-a for determination of its logic state. Accumulator 545 counts how many cells 505-a have been determined to be in the predefined logic state and the reference voltage is step-wise decreased (solid line) until a criterium is met (for example there is a match between the count of cells in the predefined logic state by the accumulator and a value stored in a CODEWORD BIT COUNTER 395 associated to the addressed codeword. The dashed line portion of curve 791a represents a possible further time evolution in case the match has not occurred, yet. In other examples (not shown), the time evolution may be a continuous, e.g., not step-wise, ramp such as a linear voltage ramp.

Curve 791b in diagram 700b has an increasing step-wise evolution with time. It may be an example of curve 691b discussed with reference to FIG. 6 (diagram 600b). At each time interval, the reference voltage has a constant value that is provided by a common reference voltage generator 535 to the sense component 550 of each memory cell 505-a for determination of its logic state. Accumulator 545 counts how many cells 505-a have been determined to be in the predefined logic state and the reference voltage is step-wise decreased (solid line) until a criterium is met (for example there is a match between the count of bit-flipped cells in the predefined logic state by the accumulator and a value stored in a CODEWORD BIT COUNTER 395 associated to the addressed codeword). The dashed line portion of curve 791b represent a possible further time evolution in case the match has not occurred, yet. In other examples (not shown), the time evolution may be a continuous, e.g., not step-wise, ramp such as a linear voltage ramp.

Curve 791c in diagram 700c has an increasing step-wise evolution with time that differs from curve 791b of diagram 700b in that the rate of change (or the step amplitude) is not constant in time. This example may be useful in some cases to further accelerate the meeting of the criterium, in some embodiments. Consider a case in which 114 bits (out of a 256 bits codeword) are known to be in the predefined logic state, for example (or anyhow the value in CODEWORD BIT COUNTER is representative of a fairly large number of bits); if the actual number of memory cells determined to be in the predefined logic state by the accumulator is substantially lower than the expected number, it may be decided to use a large reference voltage step (early stage of curve 791c), while it may be decided to use a lower step reference voltage increase (later stage of curve 791c) when the number of cells determined to be in the predefined logic state approaches the expected number, for example. It is also clear that, in case the expected number of cells in the predefined logic state is exceeded without the match with the value in CODEWORD BIT COUNTER having been satisfied, the voltage reference may be decreased with respect to the last modified voltage value (e.g., the highest reference voltage value depicted in diagram 700c) or increased (if the voltage ramp was a decreasing one) to finally have the criterium met.

Curves in diagram 700d show additional examples in which the reference voltage amplitude does not have a monotonic time evolution. More specifically, solid curve 791d1 depicts an example according to which a reference voltage range is partitioned according to a partitioning method, such as a dichotomic partitioning. Dashed curve 791d2 depicts another possible time evolution of reference voltage in case of a codeword with a different number of bits in the predefined logic state, or in case of a different codeword featuring a different threshold voltage distribution of bits. It should be noted that the dichotomic partitioning described above is not a limiting feature and rather, in general, any reference voltage range partitioning method may be used.

In the embodiments described insofar, the criterium used to end the reading operation was a match between the number of cells (e.g., n) being determined to be in the predefined logic state and the expected number of bits in that given logic state, e.g., the value (e.g., N) stored in CODEWORD BIT COUNTER 395 when the codeword was programmed. In other words, the read operation ends when n=N. In the following, and more specifically with reference to FIG. 8, it will be described how the reading operation may be further shortened, if an error correction engine (ECC) is available.

Figure 8:
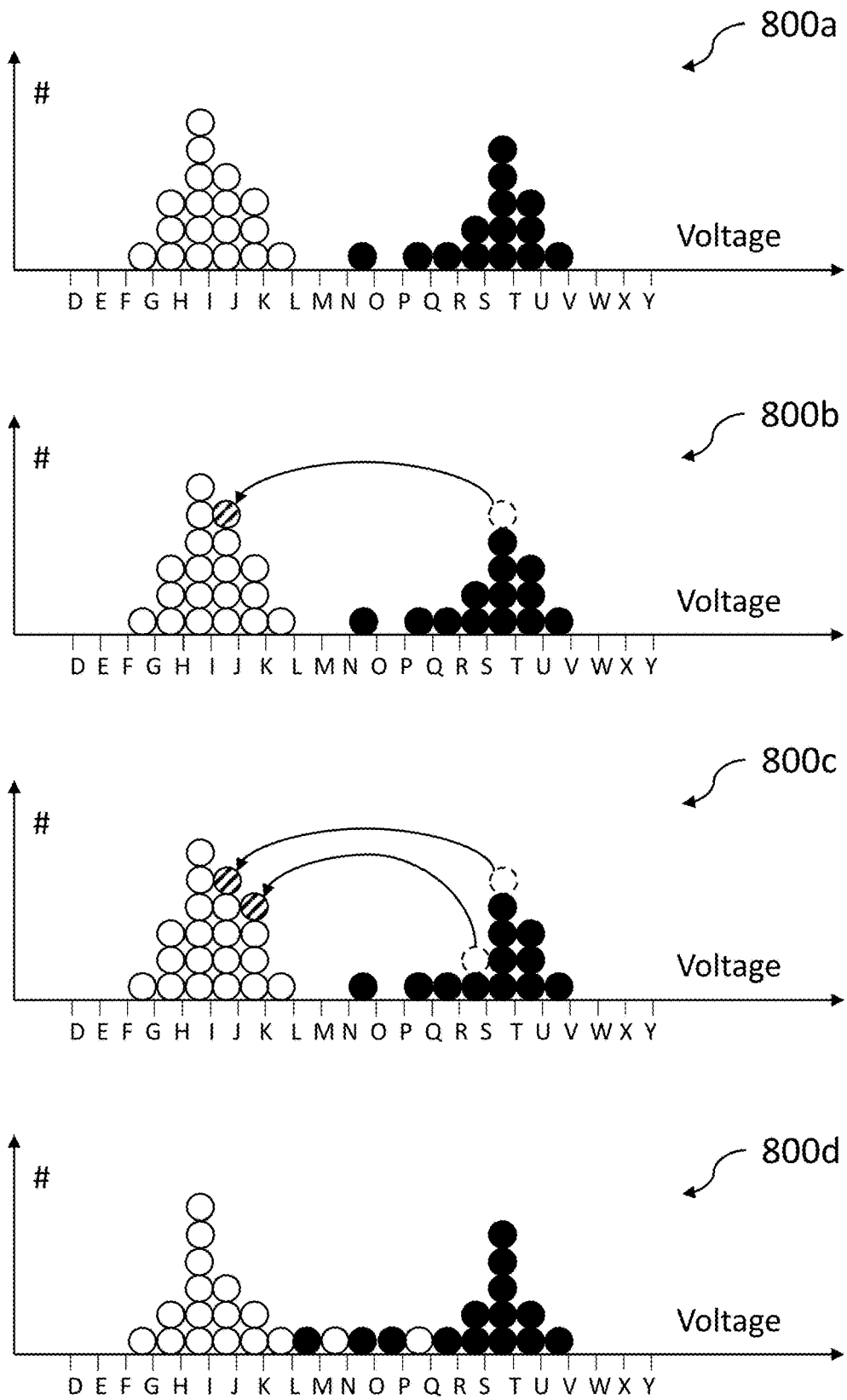
FIG. 8 illustrates voltage distributions of memory cells in a memory array that supports counter-based read in accordance with embodiments of the present disclosure.

FIG. 8 illustrates voltage distributions of memory cells in a memory array that supports counter-based read in accordance with embodiments of the present disclosure.

Diagram 800a depicts threshold voltage distributions of memory 32 cells (a 32 bits codeword, considering DATA and PARITY bits). In the depicted example 18 bits are programmed to a logic 0 (e.g., low threshold, white circles) and 14 bits are programmed to a logic 1 (e.g. high threshold, black circles)—for simplicity no bit flip is considered, but similar reasoning may be applied in case bits have been flipped, as discussed above. Accordingly flip-bit is unflagged (or 0) and CODEWORD BIT COUNTER stores the value 14, corresponding to the number of cells expected to be in predefined logic state 1. Of the 18 logic state 0 bits, in the depicted example, 1 bit has threshold in the voltage range F-G, 3 bits in G-H, 6 bits in H-I, 4 bits in I-J, 3 bits in J-K and 1 bit in K-L. Of the 14 logic bits in logic state 1 bits, 1 bit has threshold in the voltage range N-O, 1 bit in P-Q, 1 bit in Q-R, 2 bits in R-S, 5 bits in S-T, 3 bits in T-U and 1 bit in U-V. No bits have threshold in other voltage ranges. Clearly this is just an example of threshold voltage distributions and other distributions, as well as different number of bits, are possible.

According to the methods described above, a reference voltage ramp may be started at reference voltage Y (e.g., VREF=Y), that may correspond to VHSA in FIG. 6, and modified, for example stepwise decreased. Until reference voltage is V or higher (VREF≥V), no cell in the predefined logic state is detected (let x be the count of cells in the predefined logic state; then x=0). When VREF=U, x=1, e.g., one cell is detected but no match occurs (1≠14). When VREF=T, x=4≠14; when VREF=S, x=9≠4; when VREF=R, x=11≠14, when VREF=Q, x=12≠14, when VREF=P, x=13≠14, when VREF=O, x=13≠14 and, finally, when VREF=N, x=14 and the match occurs, the criterium is met and the read operation ends. Each of the bit associated with cells determined to be in logic state 1 is assigned logic state 1; all other bits are assigned logic state 0. No bit flipping is necessary so data may be output based on the determining the logic states according to a last modified reference voltage. The reference voltage may be modified according to a different approach, such as in accordance to a dichotomic partitioning of a reference voltage range, as it was described with reference to diagram 700d, for example. In such a case, the sequence of reference voltage values may be (see diagram 800a): VREF=O (with x=13≠14), VREF=L (with x=14 corresponding to a match); as it can be seen, a very fast convergence may be obtained with this technique.

According to some embodiments, if an error correction engine (ECC) is available, e.g., either embedded in the memory apparatus or in the system comprising the memory, the ECC algorithm may be applied to the read out whenever the count of cells determined to be in the predefined logic state differs from the value stored in the CODEWORD BIT COUNTER by no more than an error detecting power of the error correction algorithm (ECC). For example, if an ECC engine with error detection and/or correction capability of one error in the codeword (e.g., a single bit error can be detected and corrected), the ECC may be applied when the number of cells (x) in the predefined logic state (e.g., 1 in the example above) is N−1, N or N+1.

Just to describe an example with reference to diagram 800a, if VREF=P then x=13, that differs from 14 by no more than the correction capability of 1 (x=13=N−1), the ECC may be applied and the correct codeword may be determined because one error is detected (the one corresponding to the memory cell with threshold in the range N-O) but it may be corrected. Similarly, if during the reference voltage variation, it is set to K, x=15 cells would be determined to be in the predefined logic state (e.g., all those with threshold voltage higher than K, including all the black circles and the cell with threshold voltage in the range K-L). By applying the ECC engine to the read out, one error is detected and corrected, so that the correct codeword data may be output. In a similar fashion, if an ECC engine with higher correction capability is available (for example to correct 2 errors), it may be applied to the red out when VREF=Q. In this case, all bits corresponding to cells with threshold voltage higher than Q are correctly read, while the 2 bits corresponding to cells with threshold voltage in the range N-Q can be corrected by the ECC engine. Extension to higher error capability ECC is straightforward.

Sometimes more ECC engines are available with different error detection and/or correction power or capability. For example, a first, simpler error correction engine ECC1 may detect up to 2 errors but only correct 1 error, and a second, more complex and often slower, error correction engine ECC2 may correct 2 errors and be applied only when necessary. In such context, if the first error correction algorithm (ECC1) detects an error that ECC1 cannot correct, the second error correction algorithm (ECC2) is applied to correct the detected errors, and an output based on the applying the second error correction algorithm is provided. So, if VREF=Q and ECC1 detects 2 errors (cells in range N-Q) but is unable to correct both, then ECC2 is activated and the correct codeword may be obtained, for example.

It is observed that the disclosed method, e.g., based on counting cells in a predefined logic state, may be subject to failure in case one or more cells lose the data stored therein; it may happen that the threshold voltage of a memory cell shifts, drifts, is disturbed or anyhow moves or is erroneously detected during the life of a memory device. For example, with reference to diagram 800b, the threshold voltage (in range S-T) of one memory cell (white circle with dashed border) initially programmed to logic state 1 may change to a different, for example lower, threshold voltage (in the depicted example in the range I-J, that would normally correspond to a memory cell programmed in the logic state 0 (stripe filled circle). If the reference voltage is modified until the expected number of cells in the predefined logic state is determined (e.g., x=14 continuing with the example), VREF would need to be changed down to K. At this reference voltage value, however, the logic state determination of the codeword bits results in 2 (two) errors even if a single cell has failed; the two errors correspond to the actual failing cell (not detected at the originally programmed logic state 1, at threshold voltage S-T) and the cell with threshold voltage in range K-L, that was initially programmed to logic state 0 and is now wrongly assigned a logic state 1. Similar considerations may be done in case of two failing memory cells, as depicted in diagram 800c: reading with respect to reference voltage intermediate between the originally programmed and final threshold voltages will result in twice the error count with respect to each failing cell.

According to the method here disclosed, a first error correction engine ECC1 may detect two errors (possibly corresponding to a sole failing memory cell, and it may correct both errors if it has a sufficient correcting power or capability; otherwise a second, more powerful, correcting error ECC2 may be applied to correct both errors. So, again with reference to diagram 800b, when VREF=N, the count of memory cells in the predefined logic state (e.g., 1) is 13 (e.g., 14−1 or N−1) because of a failing cell, the first error correction engine ECC1 may detect the two errors and, if it is not capable of correcting both, the second error correction engine ECC2 is applied to correct them.

According to another embodiment, an error correction algorithm ECC with given detection power and given correction power or capabilities may be applied to the determined logic states when the number of cells in the predetermined logic state is within the detection capability of the ECC. If the ECC is also able to correct the data based on its correction power, the reading operation ends. If, on the contrary, the power capability is insufficient, the reference voltage is further modified to a different value and the ECC algorithm is applied to a new read-out with respect to the modified reference voltage in a sort of try and repeat process. In other words, an ECC algorithm is multiply applied to the determined logic states of each respective cell with respect to modified reference voltages while the count of cells determined to be in the predetermined logic state differs from a value stored in a counter (e.g., the CODE-WORD BIT COUNTER 385) by no more than an error detecting power of the error correction algorithm (ECC). The ECC algorithm may be successful in correcting more errors than its nominal correction power or capability when it is multiply applied to read outs with respect to modified reference voltages resulting in a count of cells in the predefined logic state within the error detection capability.

The try and repeat approach described above is especially useful if the threshold voltage distributions, as programmed or as resulting from drift, disturbs, or any other perturbation, overlap. Diagram 800d depicts such an overlapping threshold distribution situation; cells programmed to the low threshold state (white circles) but in the high tail of the distribution may have a threshold voltage that is higher than some cells programmed in the high threshold state (black circles) but in the low tail of the distribution. For example, (black) cells programmed to the logic 1 state with threshold voltage in the range L-P have threshold voltage lower than threshold voltage of (white) cell programmed to the logic state 0 but having threshold voltage in the range P-Q. Similarly, (white) cells programmed to the logic 0 state with threshold voltage in the range M-Q have higher threshold voltage than (black) cell programmed to the logic 1 state and having threshold voltage in the range L-M. Other overlaps are present as evident from the drawing. Since the two distributions overlap, it would be impossible to find a reading voltage able to distinguish the two distributions according to conventional reading methods; as a matter of fact there is no window nor margin between them.

According to some embodiments, during a decreasing reference voltage ramp, for example, once the count of memory cells determined to be in the predefined logic state (e.g., 1) differs from an expected number (as retrieved from CODEWORD BIT COUNTER, for example) by less than an error detection capability of the error correction engine ECC, the result of the ECC algorithm is multiply applied to the read out to detect and possibly correct possible errors. If the application of the ECC is able to correct the errors, the read operation ends (as described above, for example); otherwise the try and repeat process continues with a different reference voltage with another error correction trial. Just as an example, assuming an ECC with error detection capability of 4 errors and error correction power of 2 errors (e.g., 4 errors may be detected, but only 2 errors may be corrected in a given codeword), and with reference to diagram 800d, when the reference voltage is VREF=Q the number of cells with threshold voltage higher than VREF is x=11. The ECC is able to detect 3 errors, that corresponds to (black) cells in range L-P, but it is not capable to correct them all to provide the correct output. A second trial is then given at VREF=P when x=12 with 4 errors (the 3 black cells in range L-P and the white cell in range P-Q) that, again, cannot be corrected. A further trial may be dome at VREF=O when x=13 and 3 errors are present. Continuing with the trial and repeat process, at VREF=N the cell count is x=14 and 2 errors are detects (the black cell in range L-M and the white cells in range P-Q) so that the error correction engine may not only detect the presence of some errors but actually also correct them because the number of errors is within the correcting power of the ECC. The same outcome would have been achieved even applying a reference voltage VREF=L, when all (black) cell programmed to 1 would have been correctly read and two (white) cells (namely those in ranges M-N and P-Q) would have been incorrectly read, but correctable by the ECC.

Figure 9:
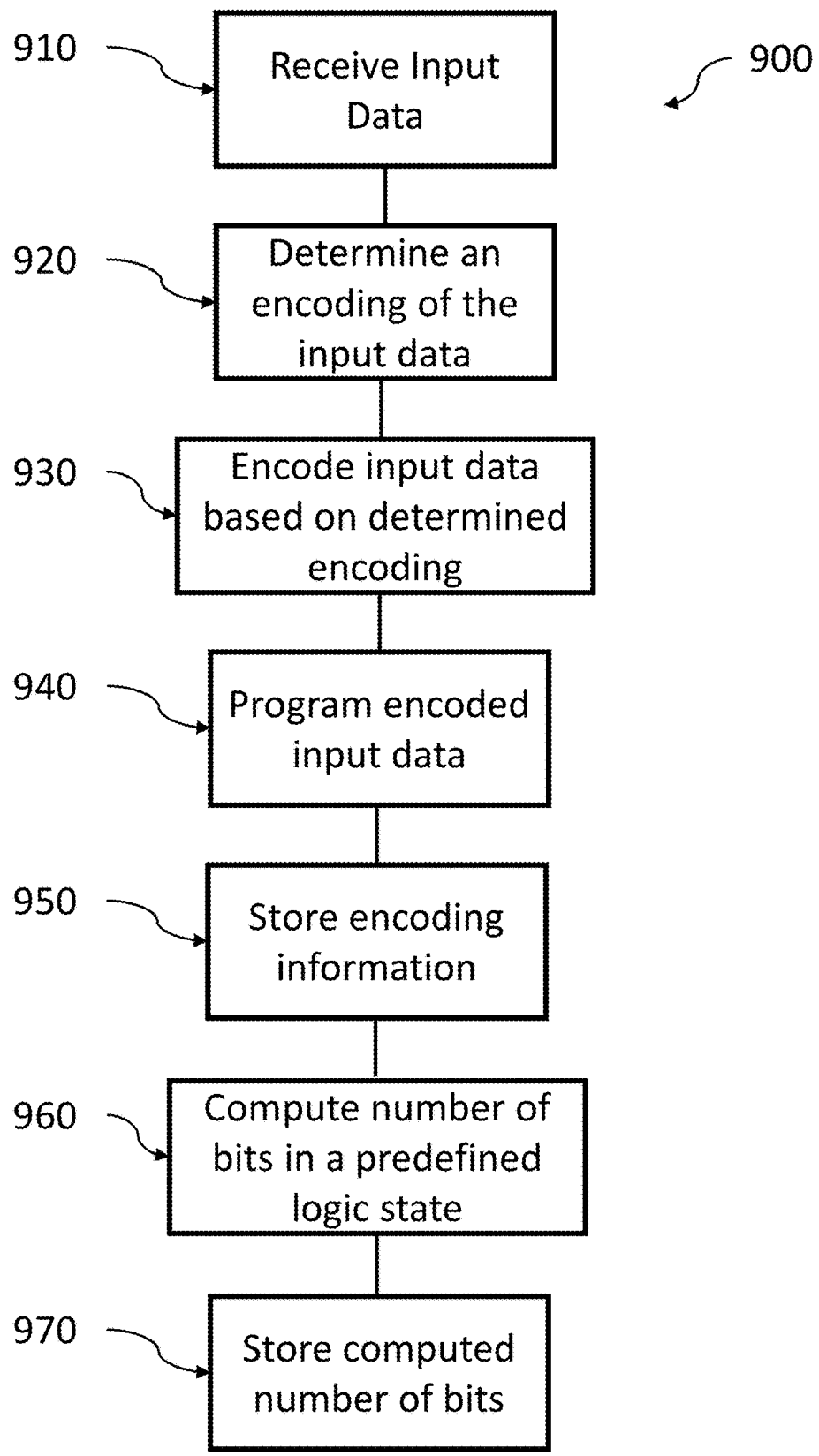
FIGS. 9 through 11 illustrate methods for counter-based read using a memory device in accordance with embodiments of the present disclosure.
Figure 10:
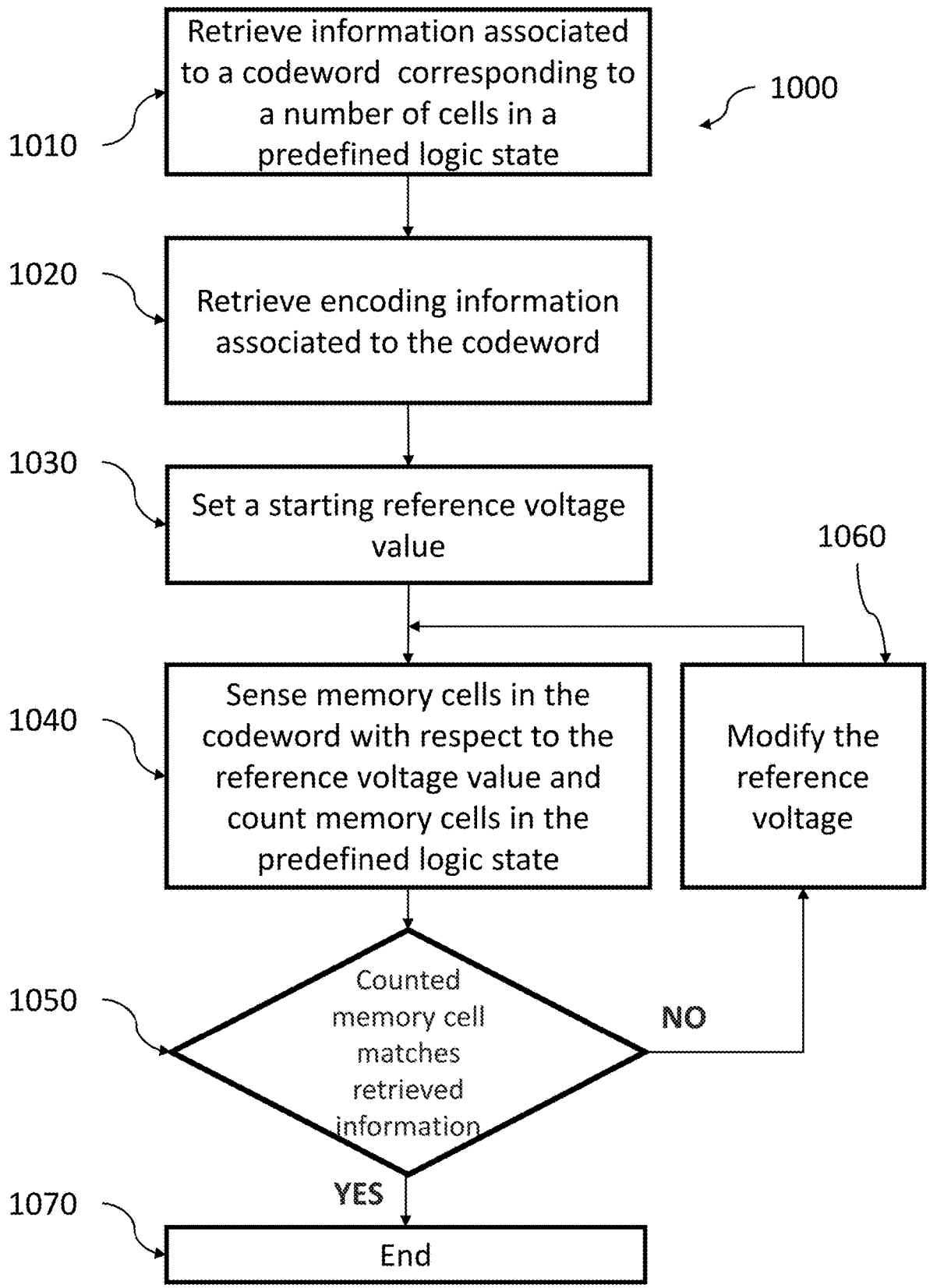
Figure 11:
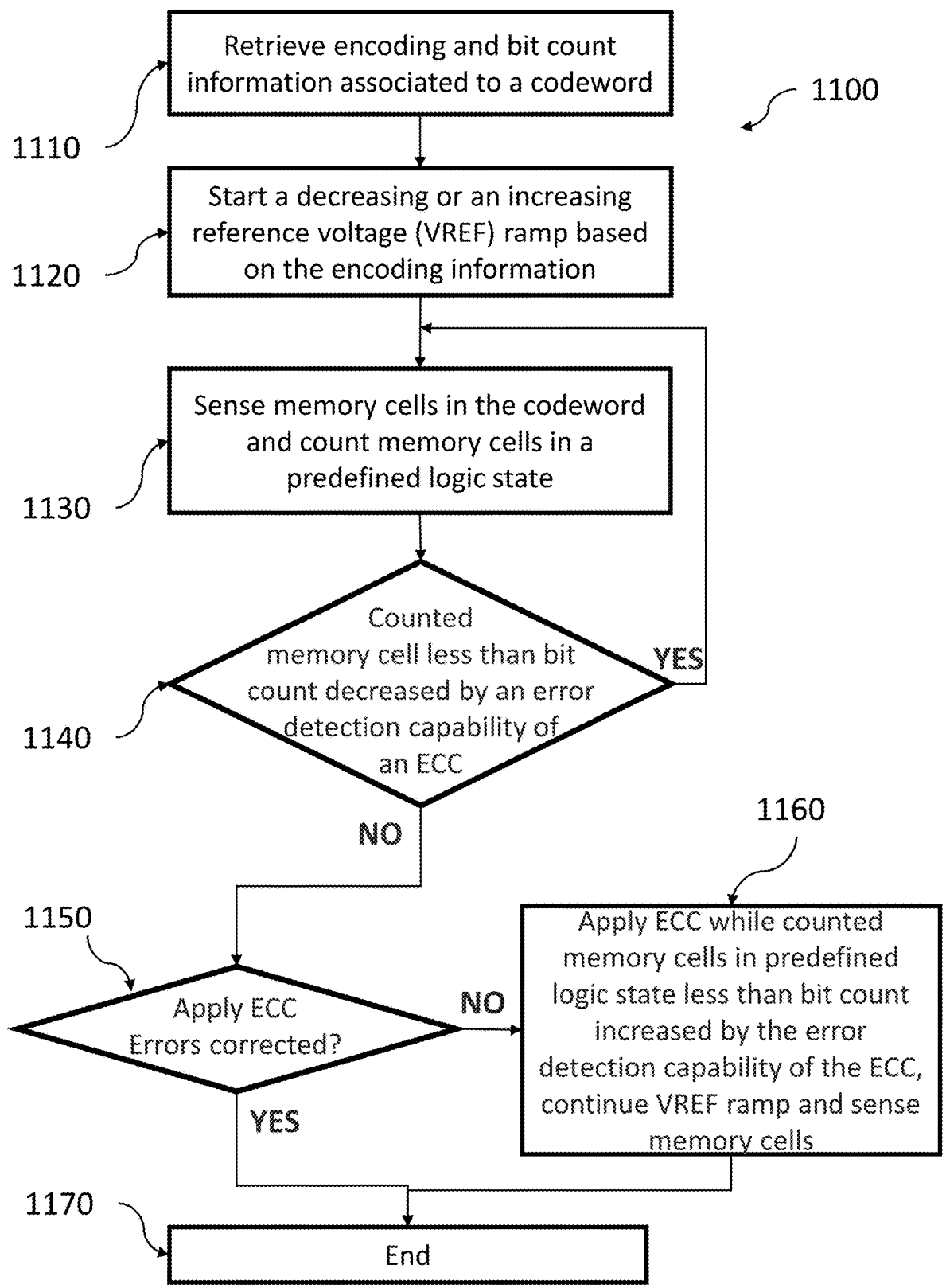

FIGS. 9 through 11 illustrate methods for counter-based read using a memory device in accordance with embodiments of the present disclosure.

FIG. 9 is a flow diagram of a method 900 to store information according to some embodiments. The stored information may correspond to CODEWORD DATA 300 in some examples.

Method 900 comprises, at step 910, receiving input data for writing in memory cells 105 of a memory array. Received input data may comprise DATA bits 380 and, in some cases, PARITY bits 385; in some cases, only DATA bits 380 are received. Input data may be received through I/O component 160.

Method 900 comprises, at step 920, determining an encoding of the input data. Method 900 comprises, at step 930, encoding input data based, at least in part, on the determined encoding. Determining the encoding of the input data may comprise bit-flipping input data, in some embodiments, Bit-flipping may be based on a count of bit in input data in a predefined logic state; for example bit flipping may result in bits in the predefined logic state being less or equal to 50% of the CODEWORD DATA. In other embodiments the encoding may involve encoding more complex than bit-flipping and it may possibly result in the encoded input data having a number of bits in the predetermined logic state within a predetermined range (e.g., between 20% and 40%, or between 25% and 30%). In some embodiments, encoding input data comprises computing PARITY bits 385 for completing the CODEWORD DATA 300. PARITY bits 385 may be encoded, too.

Method 900 comprises, at step 940, programming the encoded input data. Programming may comprise writing the encoded input data to memory cells 105 of a memory array 100 according to the methods described with reference to FIGS. 1, 2 and 5.

Method 900 comprises, at step 950, storing encoding information corresponding to the encoding determined at step 920. In some embodiments storing the encoding information may comprise storing a flip-bit BF or a number of bits related to flip-bit information; the flip-bit information may be stored according to a majority voting scheme, or in differential form BF[k:0];BF#[k:0], in some examples. Flip-bit information may be quickly retrieved during a fast counter and BF read operation 416b. The encoding information may be stored in non-volatile memory cells associated to the CODEWORD DATA 300, and it may be copied in volatile memory for faster availability at possible future accesses.

Method 900 comprises, at step 960, computing a number of bits in programmed encoded input data, e.g., in CODEWORD DATA 300, that are in a predefined logic state.

Method 900 comprises, at step 970, storing the computed number of bits in non-volatile and/or in volatile memory. The predefined logic state may be one of a 1 logic state and a 0 logic state. In some embodiments storing the computed number of bits may comprise storing a COUNT in a BIT COUNTER memory portion associated to the codeword. The COUNT may be stored protecting the counter bits by using a majority voting scheme for each bit, or programming each bit in differential form, in some examples. Bit count information may be quickly retrieved during a fast counter and BF read operation 416*b*. The number of bits in the predefined logic state will be used in future access operations to the codeword as described above with reference to FIGS. 3, 4 and 6-8 and according to the methods further described below.

Method 900 may include more or less steps than those illustrated in FIG. 9 and the sequence in which the steps are carried out may be modified with respect to the description provided above.

FIG. 10 is a flow diagram of a method 1000 for accessing a codeword in a memory device. The method may be carried out in a memory device 100, for example.

Method 1000 comprises, at step 1010, retrieving information associated to a codeword corresponding to a number of cells in a predefined logic state. Method 1000 comprises, at step 1020, retrieving encoding information associated to the codeword. The retrieving may comprise reading from a non-volatile CODEWORD BIT COUNTER 385, from a non-volatile CODEWORD ENCODER 390 or from a corresponding volatile memory portion associated to the addressed codeword. The reading may comprise evaluating a majority of bits representing bit information stored according to a majority voting scheme, in some examples. The reading may comprise reading bits and corresponding negate bits representative of bits stored according to a differential programming scheme.

Method 1000 comprises, at step 1030, setting a starting reference voltage value. In some embodiments, the starting reference voltage value is set based, at least in part, on the retrieved encoding information (such as flip-bit BF[k:0]; BF#[k:0]) and may comprise setting the starting reference voltage at a relatively high value VHSA, higher than an expected highest value of low threshold voltage memory cells, or setting the starting voltage at a relatively low value VMPL, lower than an expected lowed threshold voltage of high voltage memory cells. In other embodiments, setting the starting reference voltage value comprises setting a reference voltage value approximatively at mid range of a reference voltage range.

Method 1000 comprises, at step 1040, sensing memory cells in the codeword with respect to the reference voltage value and counting memory cells in the predefined logic state. Sensing memory cells in the addressed codeword may comprise enabling a Word Line 510-*a*, biasing a Plate Line 510, charge share charge stored on a ferroelectric capacitor 540 to a Digit Line 515-*a*, generating a respective voltage for each cell and holding it on a capacitor 516. Sensing the memory cells may further comprise comparing at a sense component 550 the held signal with a reference voltage 525 provided by a reference voltage generator 535, as described with reference to FIG. 5, for example. Counting a number of memory cells in a predefined logic state may comprise determining how many cells have a threshold voltage higher (or lower) than the reference voltage and storing the information at accumulator 545.

Method 1000 comprises, at step 1050, comparing the count of memory cells in the predefined logic state with the retrieved information associated to the codeword corresponding to a number of cells in the predefined logic state. In case of a match (branch YES in FIG. 10), the reading operation ends and data may be output at 1070. Before outputting data, possible decoding according to the retrieved encoding information may be carried out—for example, bit flipping may be applied to the memory cells sensed with respect to the last modified reference voltage. A match between the counted memory cells (as sensed with respect to the last modified reference voltage) and the retrieved information associated to the codeword corresponding to the number of cells in the predefined logic state may be considered to occur if the two values are the same, in some embodiments. For example, referring to the description of diagrams in FIGS. 6 and 7 and diagram 800*a* in FIG. 8, a match occurs if a number of memory cells with threshold higher (or lower) that the reference voltage as last modified is the same as an expected number of memory cells in that logic state, as stored in and retrieved from the CODEWORD BIT COUNTER 380, for example. In other embodiments, a match is considered to occur even if the number of memory cells determined to be in the predefined logic state when read with respect to the last modified reference voltage is not exactly the same as an expected number of memory cells in that predefined logic state, but the two numbers differ by no more than a correcting power of an error correction engine (ECC), as described with reference to FIG. 8, for example. In the latter case, the ECC may correct errors in the read codeword data before it is output. A second, more powerful, error correction engine may be activated in some circumstances, if the first error correction engine can only detect but not correct all the errors.

If no match is found at step 1050 (branch NO in FIG. 10), method continues, at step 1060, with modifying the reference voltage and then again from step 1040. Modifying the reference voltage may comprise decreasing the reference voltage according to a stepwise (or sometimes linear) ramp, in some embodiments. Modifying the reference voltage may comprise increasing the reference voltage according to a stepwise (or sometimes linear) ramp, in some embodiments. Whether to increase or decrease the reference voltage may depend on encoding information associated to the codeword retrieved at step 1020. For example, if no bit-flipping was used (e.g., DATA and PARITY bits have been programmed with their true value), a decreasing voltage ramp may be used, while, if bit-flipping was used (e.g., DATA and PARITY bits have been programmed with their false value), an increasing voltage ramp may be used. Other ways to modify the reference voltage are also possible; for example the reference voltage may be modified according to a varying speed (as discussed with reference to diagram 700*c*, for example, and/or according to a reference voltage range partitioning, such as a dichotomic partitioning, as discussed with reference to diagram 700*d*, for example.

FIG. 11 is a flow diagram of a method 900 to access a codeword according to some embodiments. The stored information may correspond to CODEWORD DATA 300 in some examples.

Method 1100 comprises, at step 1110, retrieving encoding and bit count information associated to a codeword. In some examples, encoding information may be read from CODEWORD ENCODER 390 or from a corresponding volatile memory. In some examples, bit count information may be read from CODEWORD BIT ENCODER 395 or from a corresponding volatile memory. Encoding and bit count information may be read through a fast read module during a fast read operation to have such information available before the end of reading operation of codeword memory cells. CODEWORD ENCODER and CODEWORD BIT COUNTER may have been programmed during a previous codeword programming phase, for example as described with reference to method in FIG. 9. Bit count information may be representative of an expected number of bits in the codeword (e.g., in DATA bits 380 and/or PARITY bits 385) programmed in a predefined logic state.

Method 1100 comprises, at step 1120, starting a decreasing or an increasing reference voltage (VREF) ramp based at least in part on the encoding information. For example, if the encoding information indicates that DATA 380 and/or PARITY 385 have been stored without bit flipping (e.g., the true value of the bits has been programmed) a decreasing reference voltage ramp may be started, as discussed with reference to diagrams 600a and 700a. Alternatively, if the encoding information indicates that DATA 380 and/or PARITY 385 have been stored with bit flipping (e.g., the false value of the bits has been programmed, for example to obtain a number of bits in the predefined logic state that is less than 50%) an increasing reference voltage ramp may be started, as discussed with reference to diagrams 600b and 700b.

Method 1100 comprises, at step 1130, sensing memory cells in the addressed codeword and counting memory cells in a predefined logic state. The predefined logic state may correspond to the logic state used to compute the count of memory cells stored in CODEWORD BIT COUNTER, in some examples (in other examples, e.g., when the different logic state is used, the complimentary—with respect to the total bit count in the codeword—cell count will be used in the method).

Method 1100 comprises, at step 1140, comparing the number of counted memory cells in the predefined logic state with the retrieved bit count decreased by an error detection capability of an error correction engine ECC. In some cases, the retrieved bit count may be decreased by an error correction power or capability of the ECC in the comparison. In some embodiments, during this step it is determined whether the sensed memory cells with a threshold voltage relationship with the reference voltage applied during the decreasing or increasing ramp are too few to apply the ECC (e.g., if the count is less than the target or expected number reduced by the ECC power), or the cells count is sufficiently close to the expected number to allow for a trial to correct possible errors by the ECC. In the former case, e.g., $x<N-DP_{ECC}$, where x represents the number of memory cells in the predefined logic state, N represents the number of bits expected to be in the predefined logic state (e.g., the value in CODEWORD BIT COUNTER) and $DP_{ECC}$ represents a detection power or capability of the ECC engine, method 1100 continues (branch YES of step 1140) at step 1130 counting memory cells in the predefined logic state when sensed with respect to the decreased or increased reference voltage. In the latter case, e.g., the $x \geq N-DP_{ECC}$ (branch NO of step 1140) method 1100 continues with applying ECC at step 1150 as described below.

At step 1150 of method 1100, in some cases, the ECC will be able to correct error(s), while in other cases the ECC may only be able to detect presence of errors but the number of errors is outside the error correction power of the ECC, so that another trial must be done. So, if errors may be corrected by the ECC (branch YES of step 1150) the read operation ends and the codeword may be provided in output. It should be noted that in some cases there will be no errors; accordingly, it will not be necessary to correct the data as read with the last modified reference voltage. If errors cannot be corrected at the first trial, for example because the number of errors is higher than the error correcting power of the ECC, other trials must be provided for. Accordingly (branch NO of step 1150) method 1100 continues at step 1160 with applying ECC to memory cells sensed at decreased or increased reference voltage (e.g., the reference voltage ramp continues and memory cells are read with respect to the modified reference voltage). This step is repeated while the number of memory cells in the predefined logic state is less than the bit count (es retrieved from CODEWORD BIT COUNTER, for example) increased by the error detection capability (or power) of the ECC. Therefore, in other words, the ECC algorithm is multiply applied to the determined logic states of each respective cell with respect to modified reference voltage to provide subsequent ECC trials when the count of cells in the predefined logic state is the expected number of bits in that state within a range corresponding to its error detection or correction capability.

Figure 12:
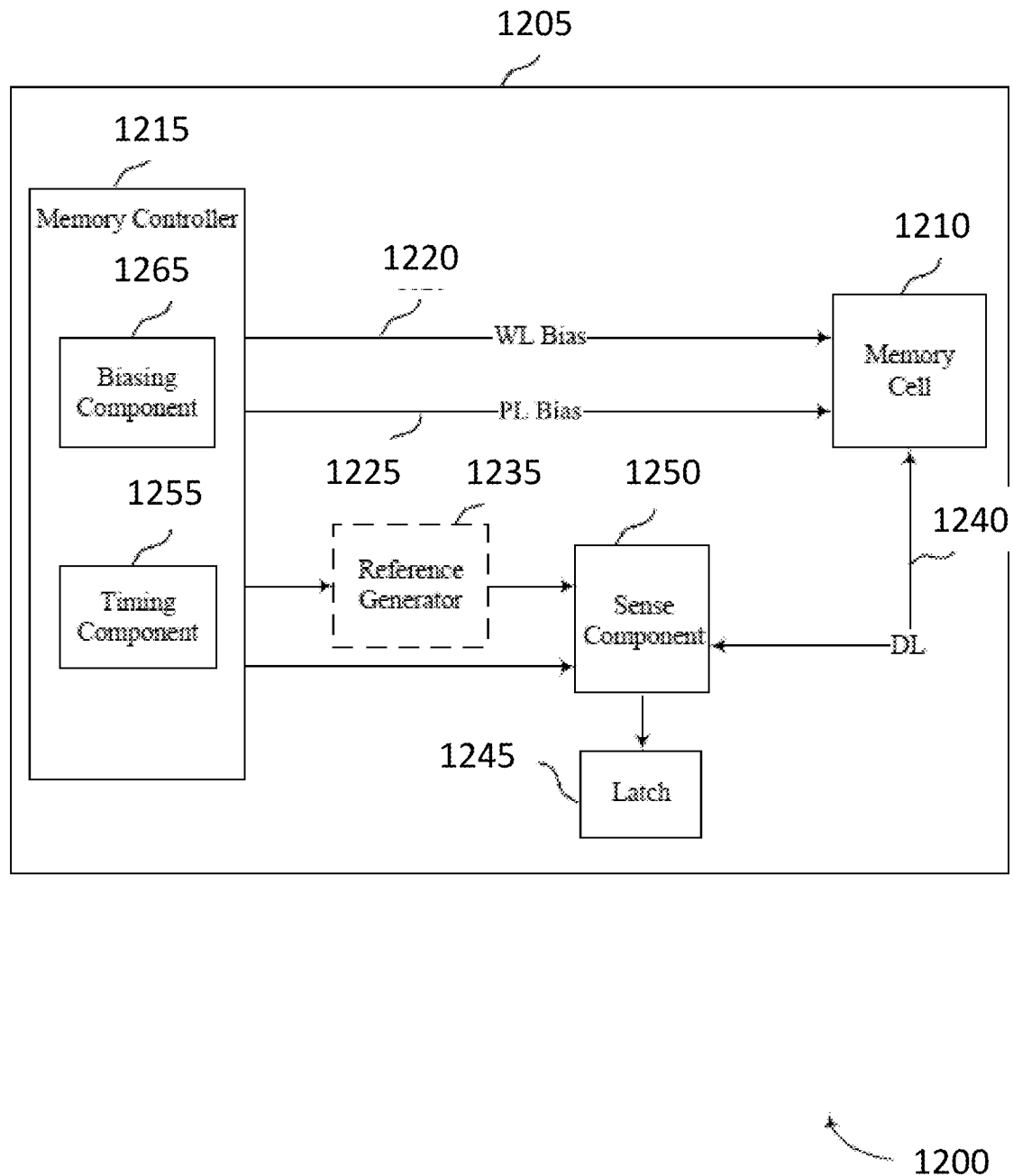
FIG. 12 illustrates a block diagram of a memory device that may support counter-based read in accordance with embodiments of the present disclosure.

FIG. 12 illustrates a block diagram 1200 of a memory device 1205 that may support counter-based read in accordance with embodiments of the present disclosure. The memory device 1205 may be referred to as an electronic memory apparatus and may be an example of a component of a memory device 100 as described with reference to FIG. 1.

The memory device 1205 may include one or more memory cells 1210, which may be an example of memory cells 105 or 505-a described with reference to FIGS. 1 and 5. The memory device 1205 may also include a memory controller 1215, a word line 1220, a plate line 1225, a sense component 1250, and a digit line 1240. These components may be in electronic communication with each other and may perform one or more of the functions described herein in accordance with aspects of the disclosure. In some cases, the memory controller 1215 may include a biasing component 1265 and a timing component 1255.

The memory controller 1215 may be in electronic communication with the word line 1220, the plate line 1225, the digit line 1240, and the sense component 1250, which may be examples of a word line 110, 510-a, a plate line 120, 510, a digit line 115, 515-a, and a sense component 150, 550 described with reference to FIGS. 1 and 5. In some examples, the memory device 1205 may also include a latch 1245, which may be an example of an I/O component 160 as described herein. The components of the memory device 1205 may be in electronic communication with each other and may perform embodiments of the functions described with reference to FIGS. 1 through 11. In some cases, the sense component 1250 or latch 1245 may be components of memory controller 1215.

In some examples, the digit line 1240 may be in electronic communication with the sense component 1250 and a ferroelectric capacitor of a memory cell 1210. A memory cell 1210 may be writable with a logic state (e.g., a first or second logic state). The word line 1220 may be in electronic communication with the memory controller 1215 (e.g., a row decoder of the memory controller 1215) and a cell selection component of a memory cell 1210 (e.g., a switching component, a transistor). The plate line 1225 may be in electronic communication with the memory controller 1215 and a plate of the ferroelectric capacitor of a memory cell 1210. The sense component 1250 may be in electronic communication with the memory controller 1215, the digit line 1240, and the latch 1245. In some examples, a common access line may provide the functions of a signal line and a reference line. An accumulator (not shown) may be in electronic communication with the sense component 1250 and the memory controller 1215. These components may also be in electronic communication with other components, inside, or outside, or both of the memory device 1205, in addition to components not listed above, via other components, connections, or busses.

The memory controller 1215 may be an example of a memory controller 165 as described herein and may be configured to activate the word line 1220, the plate line 1225, or the digit line 1240 by applying voltages to various nodes. For example, the biasing component 1265 may be configured to apply a voltage to operate the memory cell 1210 to read or write the memory cell 1210 as described above. In some examples, the memory controller 1215 may include one or more of a row component 125, a column component 135, or a plate component 145, or may otherwise perform one or more operations described with reference to row components 125, column components 135, or plate components 145, or may otherwise communicate with a row component 125, a column component 135, a plate component 145, or a combination thereof, as described with reference to FIG. 1, which may enable the memory controller 1215 to access one or more memory cells 1210. The biasing component 1265 may provide voltages (e.g., voltage sources) for coupling with the memory cell 1210. Additionally, or alternatively, the biasing component 1265 may provide voltages (e.g., voltage sources) for the operation of the sense component 1250 or the reference component 1230.

In some cases, the memory controller 1215 may perform one or more of its operations using the timing component 1255. For example, the timing component 1255 may control the timing of the various word line selections or plate biasing, including timing for switching and voltage application to perform the memory functions, such as reading and writing, discussed herein (e.g., in accordance with operations described with reference to timing diagram 400 of FIG. 4). In some cases, the timing component 1255 may control the operations of the biasing component 1265. In some cases, the timing component 1255 may include a timer associated with memory sections 110 of the memory device 1205.

The sense component 1250 may compare a sense signal from the memory cell 1210 (e.g., via digit line 1240) with a reference signal (e.g., from the reference component 1235, from the memory cell 1210). Upon determining the logic state, the sense component 1250 may then store the output in the latch 1245, where it may be used in accordance with the operations of an electronic device that may include the memory device 1205. An accumulator component (not shown) may count the number of memory cells 1210 that have been determined to be in a predefined logic state. The sense component 1250 may include one or more amplifiers in electronic communication with the latch and the ferroelectric memory cell.

The memory controller 1215, or its sub-components, may be implemented in hardware, code (e.g., software, firmware) executed by a processor, or any combination thereof. If implemented in code executed by a processor, the functions of the memory controller 1215, or its sub-components, may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The memory controller 1215, or its sub-components, may be physically located at various positions, including being distributed such that portions of functions are implemented at different physical locations by one or more physical devices. In some examples, the memory controller 1215, or its sub-components, may be a separate and distinct component in accordance with various embodiments of the present disclosure. In other examples, the memory controller 1215, or its sub-components, may be combined with one or more other hardware components, including but not limited to an I/O component, a transceiver, a network server, another computing device, one or more other components described in the present disclosure, or a combination thereof in accordance with various embodiments of the present disclosure. The memory controller 1215 may be an example of the memory controller 1315 described with reference to FIG. 13.

In some examples, the memory controller 1215, including any subcomponents thereof, may support the described examples of access schemes for section-based data protection in the memory device 1205. For example, the memory device 1205 may include a plurality of memory cells 1210 coupled with the digit line 1240 and the plate line 1225. In some examples, each of the plurality of memory cells 1210 may include a cell selection component configured to selectively couple the respective one of the plurality of memory cells with the digit line 1240. The memory device may include a plurality of word lines 1220, each coupled with the cell selection component of the respective one of the plurality of memory cells. The memory device 1205 may also include a row decoder coupled with each of the plurality of word lines, which may be included in the memory controller 1215, or may be a separate component in communication with the memory controller 1215.

In accordance with embodiments of the present disclosure, the memory controller 1215 may be operable to perform an access to a plurality of memory cells, such as a codeword data 300, of the memory device 1205. In some examples, the memory controller 1215 may perform such operations by determining a logic state of each respective cell based on a generated reference voltage and a respective voltage of the memory cells, and modifying the reference voltage until a count of respective memory cells determined to be in a predefined logic state meets a criterium.

Figure 13:
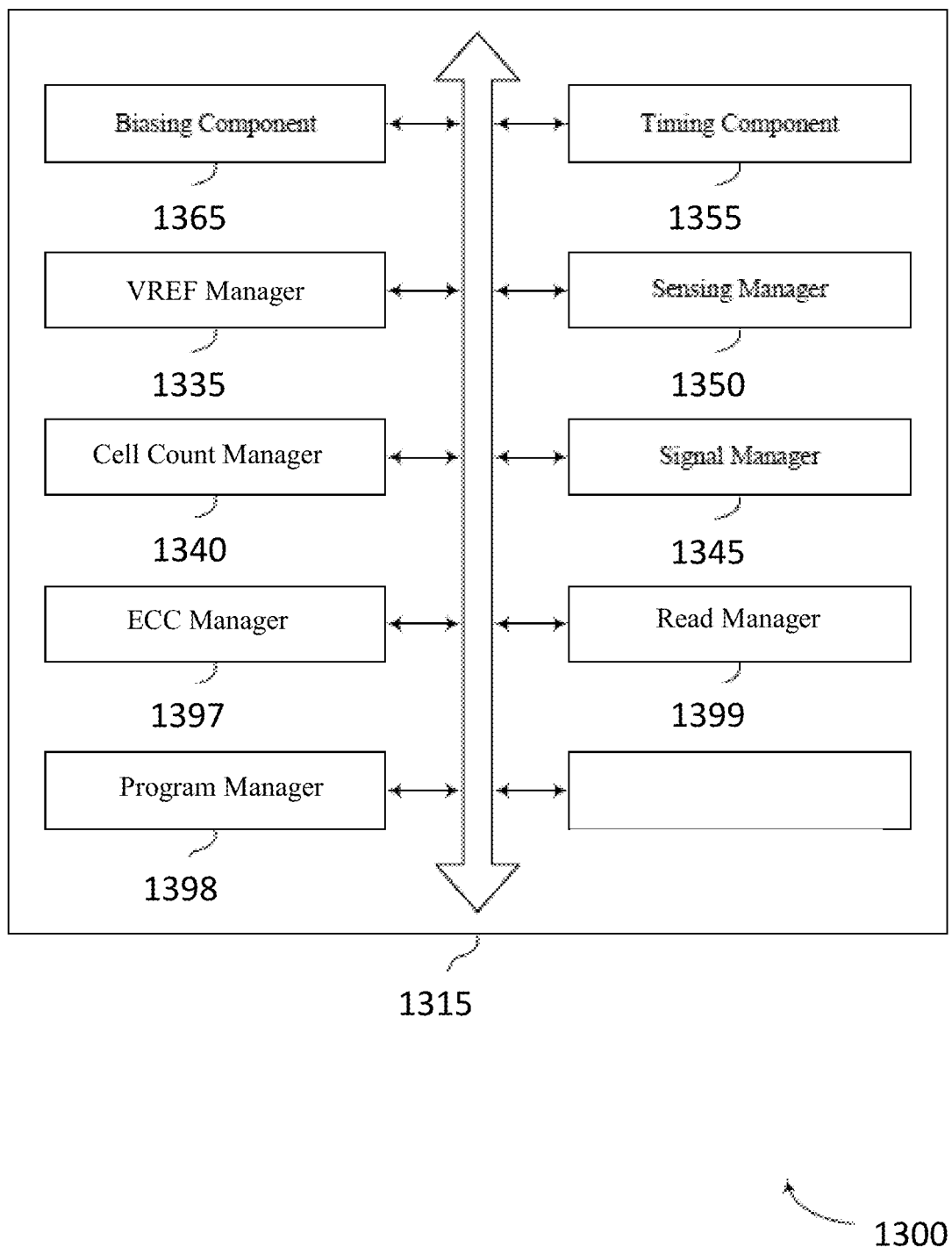
FIG. 13 illustrates a block diagram of a memory controller that may support counter-based read in accordance with embodiments of the present disclosure.

FIG. 13 illustrates a block diagram of a memory controller 1315 that may support counter-based read in accordance with embodiments of the present disclosure. The memory controller 1315 may be an example of a memory controller 165 described with reference to FIG. 1 or a memory controller 1215 described with reference to FIG. 12. The memory controller 1315 may include a biasing component 1365 and a timing component 1355, which may be examples of biasing component 1265 and timing component 1255 described with reference to FIG. 12. The memory controller 1315 may also include a signal manager 1345 that provides control signals to different components in the memory device and, in particular, cooperates with biasing component 1365 and timing component 1355 to bias memory cells 110 with appropriate WL 110, DL 115 and PL 120 voltages during access operations (e.g., program and/or read operations) as described with reference to FIGS. 1-11.

The memory controller 1315 may also include a program manager 1398 to manage access operations during a program phase. For example, program manager may manage a codeword program operation as described with reference to FIG. 9. The memory controller 1315, through its programming manager 1398 may receive the codeword input data, determine an encoding of the input data, for example based on a number of bits in a predefined logic state, encode the input data and program it to memory cells 110. The controller 1315, with the help of program manager 1398, may also compute number of encoded bits into the predefined logic state and store encoding and bit count information in memory cells 110 or in volatile memory space.

Memory controller 1315 may also include a read manager 1399 to manage access operation during a read access, such as a codeword read, for example. The read manager, in cooperation with a sensing manager 1350, a reference voltage manager (or VREF manager) 1335 and a cell count manager 1340 may implement the method described herein with reference to FIGS. 3-11, for example. The memory controller may retrieve, through a fast read component (not shown) the encoding and bit count information previously stored during a program operation of the addressed codeword. In some embodiments memory controller 1315, with the aid of the read manager 1399, the sensing manager 1350 and the VREF manager 1335, activates a plurality of memory cells 110, 505-a and biases their plate lines PL 120, 510 to develop a respective voltage, for example on a digit line DL 115, 515-a, that may be held on a capacitor 516 and compared at a sense component 150, 550 with a reference voltage 535 generated by a reference voltage generator 535. The generated reference voltage may vary according to a decreasing or an increasing voltage ramp (based on encoding information) or, in other cases, according to a range partitioning. Each memory cell in the codeword is determined to be in one or another logic state with respect to the reference voltage and the reference voltage is modified, under the control of the VREF manager 1335, until a count of cells in the predefined logic state, as determined by the cell count manager 1340, meets a criterium. In some embodiments, the criterium is a match of the memory cells count (as determined with respect to the last varied reference voltage) with a number of bits expected in that logic state, the number of bits in the predetermined logic state having been retrieved from the memory location where it was stored during the last programming operation. In some embodiments, the criterium may comprise the memory cell count not differing from the expected number of bits in the predefined logic state by more than a detection capability of an error correction engine (ECC). In these cases, under the control of an ECC manager 1397, an error correction algorithm may be applied to the memory cells of the codeword as sensed with respect to the last modified reference voltage. The ECC algorithm may be applied a plurality of times in a sort of try and repeat approach.

Biasing 1365 and timing 1355 components, as well as VREF manager 1335, signal manager 1345, program manager 1398, read manager 1399, sensing manager 1350, VREF manager 1335, cell count manager 1340, ECC manager 1397 and other components or modules in the memory controller may communicate, directly or indirectly, with one another (e.g., via one or more buses).

Figure 14:
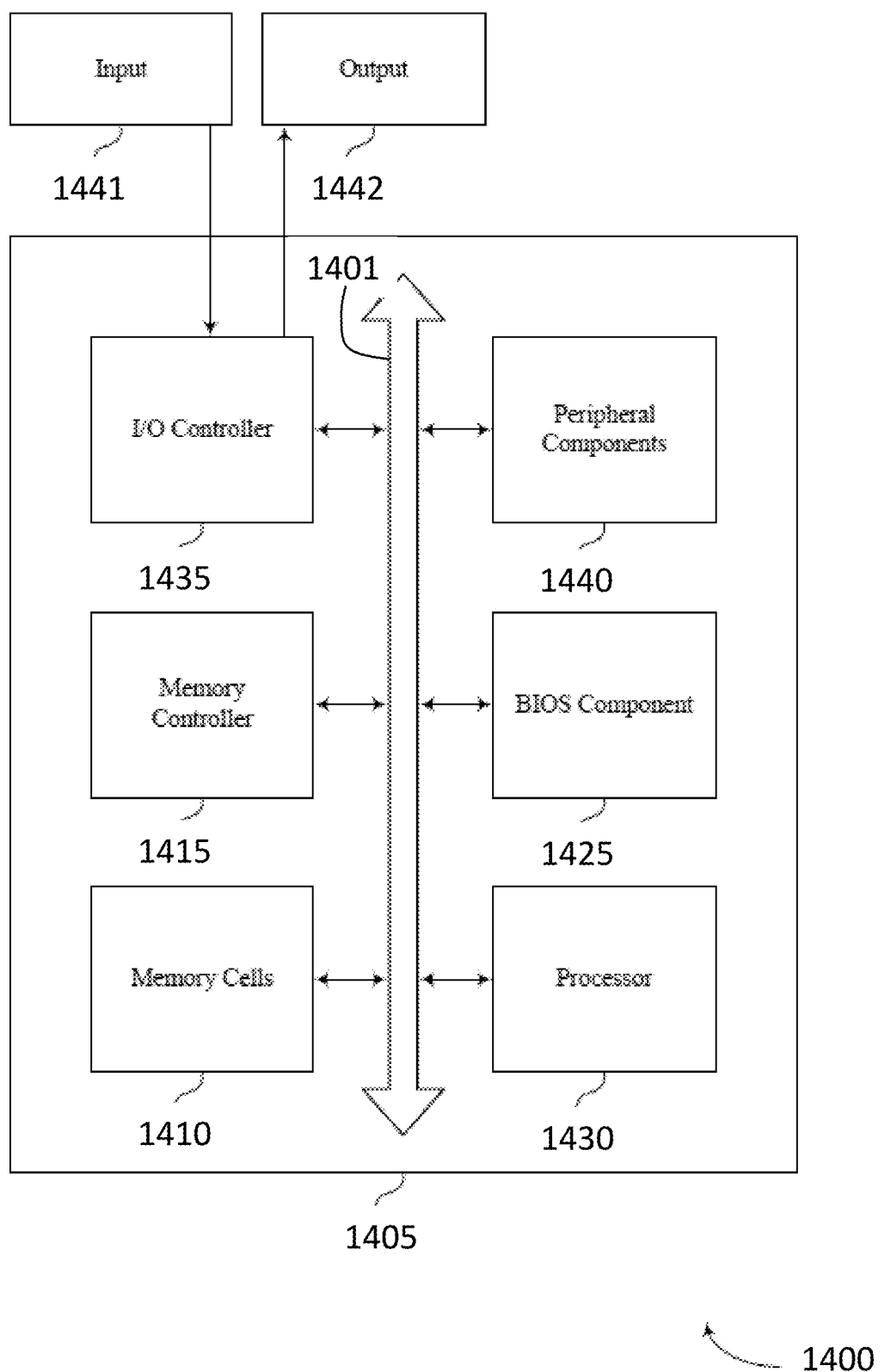
FIG. 14 illustrates a diagram of a system including a device that may support counter-based read in accordance with embodiments of the present disclosure.

FIG. 14 illustrates a diagram of a system including a device that may support counter-based read in accordance with embodiments of the present disclosure. The device 1405 may be an example of or include the components of memory device 100 as described above, for example, with reference to FIG. 1. The device 1405 may include components for bi-directional communications including components for transmitting and receiving communications, including a memory controller 1415, memory cells 1410, a basic input/output system (BIOS) component 1425, a processor 1430, an I/O controller 1435, and peripheral components 1440. These components may be in electronic communication via one or more busses (e.g., bus 1401).

The memory controller 1415 may operate one or more memory cells as described herein. Specifically, the memory controller 1415 may be configured to support the described counter-based access to memory cells. In some cases, the memory controller 1015 may include a row component, a column component, a plate component, or a combination thereof, as described with reference to FIG. 1.

The memory cells 1410 may be an example of memory cells 110 or 505-a described with reference to FIGS. 1 and 5, and may store information (e.g., in the form of a logic state) as described herein.

The BIOS component 1425 be a software component that includes BIOS operated as firmware, which may initialize and run various hardware components. The BIOS component 1425 may also manage data flow between a processor and various other components, such as peripheral components, I/O control components, and others. The BIOS component 1425 may include a program or software stored in read only memory (ROM), flash memory, or any other non-volatile memory.

The processor 1430 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component). In some cases, the processor 1430 may be configured to operate a memory array using a memory controller. In other cases, a memory controller may be integrated into the processor 1430. The processor 1430 may be configured to execute computer-readable instructions stored in a memory to perform various functions (e.g., functions or tasks supporting access schemes for section-based data protection in a memory device).

The I/O controller 1435 may manage input and output signals for the device 1405. The I/O controller 1435 may also manage peripherals not integrated into the device. In some cases, the I/O controller 1435 may represent a physical connection or port to an external peripheral. In some cases, the I/O controller 1435 may utilize an operating system such as iOS®, ANDROID®, MS-DOS®, MS-WINDOWS®, OS/2®, UNIX®, LINUX®, or another known operating system. In other cases, the I/O controller 1435 may represent or interact with a modem, a keyboard, a mouse, a touchscreen, or a similar device. In some cases, the I/O controller 1435 may be implemented as part of a processor. In some cases, a user may interact with the device 1405 via the I/O controller 1435 or via hardware components controlled by the I/O controller 1435. The I/O controller 1435 may support accessing the memory cells 1410, including receiving information associated with the sensed logic state of one or more of the memory cells 1410, or providing information associated with writing a logic state of one or more of the memory cells 1410.

The peripheral components 1440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

The input 1441 may represent a device or signal external to the device 1405 that provides input to the device 1405 or its components. This may include a user interface or an interface with or between other devices. In some cases, the input 1441 may be managed by the I/O controller 1435 and may interact with the device 1405 via a peripheral component 1440.

The output 1442 may represent a device or signal external to the device 1405 configured to receive output from the device 1405 or any of its components. Examples of the output 1442 may include a display, audio speakers, a printing device, another processor or printed circuit board, or other devices. In some cases, the output 1442 may be a peripheral element that interfaces with the device 1405 via the peripheral component(s) 1440. In some cases, the output 1442 may be managed by the I/O controller 1435.

The components of the device 1405 may include circuitry designed to carry out their functions. This may include various circuit elements, for example, conductive lines, transistors, capacitors, inductors, resistors, amplifiers, or other active or inactive elements, configured to carry out the functions described herein. The device 1405 may be a computer, a server, a laptop computer, a notebook computer, a tablet computer, a mobile phone, a wearable electronic device, a personal electronic device, or the like. Or the device 1405 may be a portion or element of such a device.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" need not suggest a physical boundary or connection point of a circuit element. Rather, "terminal" may refer to a reference point of a circuit relevant to the circuit element, which may also be referred to as a "node" or "reference point."

The devices discussed herein, including memory device 100, circuit 200, and circuit 400, described with reference to FIGS. 1, 2, and 5, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A method, comprising:
 accessing a plurality of memory cells of a memory device;
 generating a respective voltage for each respective cell in the plurality based on the accessing;
 generating a reference voltage;
 determining a logic state of each respective cell based on the respective voltage and the reference voltage;
 modifying the reference voltage until a count of respective cells determined to be in the logic state meets a criterium.

2. The method of claim 1, further comprising:
 providing an output based on the determining the logic states according to a last modified reference voltage.

3. The method of claim 1, wherein generating the respective voltage for each respective cell comprises holding the respective voltage, and wherein generating the reference voltage comprises ramping the reference voltage.

4. The method of claim 3, wherein ramping comprises stepwise increasing the reference voltage or stepwise decreasing the reference voltage based, at least in part, on a content of a bit-flip bit associated to the plurality of memory cells.

5. The method of claim 1, wherein modifying the reference voltage comprises dichotomously partitioning a reference voltage range.

6. The method of claim 1, wherein determining the logic state of each respective cell comprises determining that the each respective cell is in a first logic state when the respective voltage is lower than the reference voltage and that the each respective cell is in a second logic state when the respective voltage is higher than the reference voltage.

7. The method of claim 1, further comprising:
applying an error correction algorithm (ECC) to the determined logic states of each respective cell.

8. The method of claim 7, wherein the ECC algorithm is multiply applied to the determined logic states of each respective cell with respect to the modified reference voltage.

9. The method of claim 7, wherein modifying the reference voltage comprises modifying the reference voltage until the count of respective cells determined to be in the logic state differs from a value stored in a counter by no more than an error detecting power of the error correction algorithm (ECC).

10. The method of claim 7, further comprising:
providing an output based on the applying the error correction algorithm (ECC) in case the error correction algorithm (ECC) is capable to error correct the determined logic states of the respective cells.

11. The method of claim 7, wherein the ECC is a first error correction algorithm (ECC1) with a first correcting power, the method further comprising:
if the first error correction algorithm (ECC1) detects an error that ECC1 cannot correct, applying a second error correction algorithm (ECC2) to the determined logic states of each respective cell, the second error correction algorithm (ECC2) having a second correcting power higher than the first correcting power of the first error correction algorithm (ECC1), and providing an output based on the applying the second error correction algorithm (ECC2).

12. The method of claim 1, further comprising:
reading a counter and/or a bit-flip bit associated to the plurality of memory cells, wherein reading the counter and/or the bit-flip is not after modifying the reference voltage.

13. The method of claim 12, wherein the counter comprises one of a non-volatile memory cell, a pair of memory cells in differential arrangement, a plurality of memory cell in a majority voting arrangement, one or more memory cells for error correction, or a combination thereof.

14. The method of claim 12, wherein generating a respective voltage comprises developing a signal for each respective cell, and further comprising:
masking reading the counter and/or the bit-flip during the signal development.

15. The method of claim 1, further comprising:
programming the plurality of memory cells; and
storing in a counter a value corresponding to a number of memory cells in the plurality of memory cells in the logic state.

16. The method of claim 15, wherein programming the plurality of memory cells comprises storing in each memory cells of the plurality an encoded value wherein a count of encoded values in the logic state is a predefined value or in a predefined range.

17. The method of claim 1, wherein the plurality of memory cells comprises a plurality of ferroelectric memory cells.

18. A memory apparatus comprising:
a plurality of memory cells; and
a reference voltage generator to generate a reference voltage;
a controller configured to:
access the plurality of memory cells to generate a respective voltage for each respective cell in the plurality based on the accessing;
determine a logic state of each respective cell based on the respective voltage and the reference voltage; and
modify the reference voltage generated by the reference voltage generator until a count of respective cells determined to be in the logic state meets a criterium.

19. The apparatus of claim 18, wherein the controller is further configured to provide an output based on the determining the logic states according to a last modified reference voltage.

20. The apparatus of claim 18 further comprising:
a counter;
at least one flip bit; and
a fast read component for reading the counter and/or the flip bit.

21. The apparatus of claim 20, wherein the counter and/or the flip bit comprise one of: a non-volatile memory cell, a pair of memory cells in differential arrangement, a plurality of memory cell in a majority voting arrangement, one or more memory cells for error correction, or a combination thereof.

22. The apparatus of claim 20, wherein the fast read component is configured to mask reading the counter and/or the flip bit before or during the generation of the respective voltage for each respective cell in the plurality.

23. The apparatus of claim 18, wherein the reference voltage generator is configured to modify the reference voltage according to one of: an increasing reference voltage ramp, a decreasing reference voltage ramp, a reference voltage range dichotomic partitioning.

24. The apparatus of claim 18 further comprising:
an error correction engine (ECC) configured to apply an error correction algorithm to determined logic states of each respective cell; and wherein the controller is configured to provide an output based on the applying the error correction algorithm in case the error correction algorithm is capable to error correct the determined logic states of the respective cells.

25. The apparatus of claim 24, wherein the ECC algorithm is multiply applied to the determined logic states of each respective cell with respect to modified reference voltage.

26. The apparatus of claim 24, wherein the controller is configured to modify the reference voltage until the count of cells determined to be in the logic state differs from a value stored in a counter by no more than an error detecting power of the error correction engine (ECC).

27. The apparatus of claim 24, wherein the error correction engine is a first error correction engine (ECC1) with a first correction capability, the apparatus further comprising:
a second error correction engine (ECC2), configured to apply a second error correction algorithm to the determined logic states of each respective cell, with a second correction capability higher than the first correction capability; and
wherein the controller is configured to provide an output based on applying the second error correction algorithm in case the first error correction algorithm is not capable to error correct the determined logic states of the respective cell.

28. The apparatus of claim 18, wherein the plurality of memory cells comprises ferroelectric memory cells (Fe-RAM).

\* \* \* \* \*